US010085904B2

(12) United States Patent
Borisoff et al.

(10) Patent No.: US 10,085,904 B2
(45) Date of Patent: Oct. 2, 2018

(54) KNEELING WHEELCHAIR FRAME

(71) Applicants: Jaimie Borisoff, Vancouver (CA); Danny Leland, Coquitlam (CA)

(72) Inventors: Jaimie Borisoff, Vancouver (CA); Danny Leland, Coquitlam (CA)

( * ) Notice: Subject to any disclaimer, the term of this patent is extended or adjusted under 35 U.S.C. 154(b) by 0 days.

(21) Appl. No.: 15/566,309

(22) PCT Filed: Apr. 14, 2016

(86) PCT No.: PCT/CA2016/050433
§ 371 (c)(1),
(2) Date: Oct. 13, 2017

(87) PCT Pub. No.: WO2016/165021
PCT Pub. Date: Oct. 20, 2016

(65) Prior Publication Data

US 2018/0110664 A1 Apr. 26, 2018

Related U.S. Application Data

(60) Provisional application No. 62/147,407, filed on Apr. 14, 2015.

(51) Int. Cl.
*A61G 5/14* (2006.01)
*A61G 5/10* (2006.01)
*A61G 5/08* (2006.01)
*A61G 5/12* (2006.01)
*A61G 5/02* (2006.01)

(52) U.S. Cl.
CPC ............... *A61G 5/14* (2013.01); *A61G 5/085* (2016.11); *A61G 5/1059* (2013.01); *A61G 5/128* (2016.11); *A61G 5/02* (2013.01); *H05K 999/99* (2013.01)

(58) Field of Classification Search
CPC .......... A61G 5/14; A61G 5/085; A61G 5/128; A61G 5/1059; A61G 5/02
See application file for complete search history.

(56) References Cited

U.S. PATENT DOCUMENTS 5,240,277 A * 8/1993 Scheulderman ......... A61G 5/00 280/250.1
5,803,545 A * 9/1998 Guguin .................... A61G 5/14 297/316
6,217,114 B1 * 4/2001 Degonda .................. A61G 5/00 280/250.1

(Continued)

*Primary Examiner* — Erez Gurari
(74) *Attorney, Agent, or Firm* — Ryan W. Dupuis; Ade & Company Inc.; Kyle R. Satterwaite

(57) ABSTRACT

A wheelchair frame having a seat for supporting a forward facing occupant therein, rear wheels supporting the frame thereon proximate a rear end of the frame and front wheels supporting the frame thereon proximate a front end of the frame, further includes a front seat height adjustment mechanism which permits a height of a front end of the seat relative to the front wheels to be adjusted separately from or together with a rear end height adjustment of the rear end of the seat relative to the rear wheels. The front seat height adjustment mechanism can also be operable to lower the front seat height relative to the front wheels simultaneously with a rear seat height adjustment mechanism which is biased to raise the rear seat height relative to the rear wheels to assist users in moving from a sitting position towards a more standing position.

19 Claims, 18 Drawing Sheets

(56) References Cited

U.S. PATENT DOCUMENTS

| | | | | | |
|---|---|---|---|---|---|
| 7,921,953 | B2 * | 4/2011 | Irvine | A61G 5/128 | 135/66 |
| 2007/0296177 | A1 * | 12/2007 | Porcheron | A61G 5/14 | 280/250.1 |
| 2009/0045599 | A1 * | 2/2009 | Balcom | A61G 5/1075 | 280/250.1 |
| 2009/0146389 | A1 * | 6/2009 | Borisoff | A61G 5/02 | 280/250.1 |
| 2010/0007180 | A1 * | 1/2010 | Ovre | A61G 5/14 | 297/68 |
| 2010/0038880 | A1 * | 2/2010 | Bagg | A61G 5/02 | 280/250.1 |
| 2012/0267874 | A1 * | 10/2012 | Schrickel | A61G 5/045 | 280/304.1 |
| 2012/0292879 | A1 * | 11/2012 | Ferniany | A61G 5/14 | 280/250.1 |
| 2015/0196438 | A1 * | 7/2015 | Mulhern | A61G 5/04 | 280/5.28 |
| 2016/0158080 | A1 * | 6/2016 | Tsushima | A61G 5/14 | 135/67 |
| 2017/0156954 | A1 * | 6/2017 | Frei | A61G 5/14 | |
| 2018/0014988 | A1 * | 1/2018 | Diaz-Flores | A61G 5/006 | |

* cited by examiner

KNEELING WHEELCHAIR FRAME

FIELD OF THE INVENTION

The present invention relates to a wheelchair frame having a seat for supporting a forward facing occupant therein, rear wheels supporting the frame thereon proximate a rear end of the frame and front wheels supporting the frame thereon proximate a front end of the frame in which the frame includes a front seat height adjustment mechanism which permits a height of a front end of the seat relative to the front wheels to be adjusted separately from or together with a rear end height adjustment of the rear end of the seat relative to the rear wheels. According to one possible use scenario, the present invention may further relate to a wheelchair frame having a front seat height adjustment mechanism which can lower the front seat height relative to the front wheels simultaneously with a rear seat height adjustment mechanism which is biased to raise the rear seat height relative to the rear wheels to assist users in moving from a sitting position to a standing position.

BACKGROUND

Wheelchairs are a widespread and very successful assistive technology for people with disabilities, with evolved designs that enable activities of daily living and promote participation [1, 2]. "Ultralight" manual wheelchairs are a class of high-performance, rigid wheelchairs that typically weigh under 11 kg (25 lbs.) with wheels [3] and offer a rigid, responsive wheeling performance. Typical users of ultralight rigid wheelchairs are independent active members of the community, with disabilities such as paraplegia, low tetraplegia, spina bifida, lower limb amputation, and cerebral palsy. These people tend to use their wheelchairs for large parts of the day, relying on them for most of their personal mobility needs. Perhaps the biggest functional benefits afforded by ultralight wheelchairs are in "transfer" weight—chair weight without wheels. This is the mass that users must lift over their body as they place the wheelchair frame into their vehicle after a transfer. Transfers are one of the highest-scored essential mobility skills for daily life [4]. Propulsion also benefits from low chair weights, although one can argue that rigidity and centre of mass are as important to wheeling performance: e.g. sports wheelchairs often weigh over 18 kg (40 lbs.) [5].

While ultralight wheelchairs are optimized for wheeling, people typically spend only about 10% of their seated occupancy time in their wheelchair actually wheeling [6]. Ideally, a wheelchair would support optimized wheeling, and at the same time support other activities of daily living and better health. The Elevation™ wheelchair [7] helped introduce the concept of "dynamic wheeled mobility" to ultralight wheelchairs, offering previously unavailable "on the fly" seat height adjustment and backrest recline adjustments to the user such that various activities performed throughout the day can be matched by an appropriate seat position [8]. It is thought that use of dynamic seating may mitigate some of the health issues associated with chronic wheelchair use such as: pain and discomfort; pressure-induced tissue damage; joint immobility and contractures; spasticity; and musculoskeletal issues associated with arm propulsion [9-13]. Participation in the community may also be beneficially impacted by dynamic seating [12, 13]. A preliminary study about the use of the Elevation™ wheelchair showed that more frequent adjustments of the seat elevating feature were correlated positively with higher satisfaction with participation in the community and engagement in a wider variety of activities [14]. It is clear that changing one's position often is more beneficial than maintaining a fixed position. The tradeoff with this seat adjustability is added weight, although the Elevation™ wheelchair currently available on the market starts at a weight of only about 10 kg (22 lbs.) including wheels. Other manual wheelchairs with dynamic seating functions are not suitable for all-day use by active users (except in specialized situations), as these chairs (conventional tilt/recline, or standing wheelchairs) typically weigh in excess of 18 kg (40 lbs.).

In a paediatric use scenario, "on the fly" adjustments of front and rear seat height might be particularly advantageous. A child would derive significant benefit from raising their seat in order to be more functional and interactive with others. And lowering the seat, including the front of the seat, affords more function and interactive opportunities for a child.

The ability to stand up from a seated position is fundamental to numerous daily activities, however it can present challenges for many with people with mobility impairments. For wheelchair users, this task is complicated by footrests that must be cleared from the front of the wheelchair prior to standing. To do this independently, a user must lean forward towards the ground to swing the footrests away. This is physically challenging or impossible for many users, particularly for seniors with limited flexibility and compromised balance.

Accordingly, it is desirable to improve the sit to stand (STS) activity often performed by some wheelchair users who have residual standing (and perhaps ambulation) function. Prior to exiting or entering a manual wheelchair, a user typically has to lean down and either swing away the footrest hangers to the side, lift the footrests to the vertical retracted position, or often both. Either motion can be difficult for some manual wheelchair users, particularly those with limited upper extremity mobility and/or limited forward leaning flexibility. Consequently, these users will constantly require help from caregivers to retract the footrest before they get in and out of wheelchairs. Retracting the footrests is also an awkward task for caregivers, who will have to bend over or crouch to raise the footrests. Additionally, physical contact with the footrests can be undesirable due to accumulation of dirt and potentially infectious agents onto the footrests over time. Thus, it would be a beneficial method for improving STS in wheelchairs to not have to move the footrests during the STS activity.

It is also desirable sometimes to have a mechanism to fully stand while supported in the wheelchair. This style of wheelchair is usually called a standing wheelchair. In this situation, a user would not walk away from the wheelchair, rather they would raise the rear of the seat towards a near vertical position while standing firmly on the footplate. Straps at various locations, including the knees, would secure the person into the wheelchair. A stability mechanism is also used to prevent unsafe forward tilt of the wheelchair in the standing position.

SUMMARY OF THE INVENTION

According to one aspect of the invention there is provided a wheelchair frame comprising:

a main frame portion having a front end and a rear end;

a seat supported on the main frame portion so as to be oriented to support an occupant therein in a forward facing orientation;

two rear wheels supporting the main frame portion thereon proximate the rear end of the main frame portion;

two front wheels supporting the main frame portion thereon proximate the front end of the main frame portion;

a front seat height adjustment mechanism operatively connected between the seat and the two front wheels so as to effect dynamic adjustment of height of a front end of the seat relative to both of the front wheels simultaneously between a first position and a second position in which the height of the front end of the seat is reduced relative to the first position.

The front seat height adjustment mechanism is intended to allow a user in the wheelchair to dynamically adjust a height of a front end of the seat relative to both front wheels on the fly. That is, the user can modify the front seat height quickly and efficiently while seated in the wheelchair without any additional tools or auxiliary equipment being required.

In some embodiments, the first position corresponds to a normal driving position and the second position corresponds to a kneeling position; however, in further embodiments, the first position may correspond to a raised position which is elevated relative to the normal driving position and the second position corresponds to either one of a normal driving position or a kneeling position.

When the wheelchair frame further comprises a rear seat height adjustment mechanism operatively connected between the main frame portion and the seat so as to effect adjustment of height of a rear end of the seat relative to the rear wheels, preferably the rear seat height adjustment mechanism enables height of a rear end of the seat to be elevated from a normal driving position towards a semi-standing position or a standing position when the front seat height adjustment mechanism is in the second position.

The front seat height adjustment mechanism may be operable independently of the rear seat height adjustment mechanism, or alternatively, the front seat height adjustment mechanism and the rear seat height adjustment mechanism may be linked to a single actuating member such that actuation of the single actuating member enables both lowering of the front end of the seat from the first position to the second position and raising of the rear end of the seat from the normal driving position to either one of the semi-standing (i.e. STS) or the standing position.

Preferably the rear seat height adjustment mechanism is biased towards the standing position and the front seat height adjustment mechanism is biased towards the first position, but the biasing on each can be overcome by weight of the user.

When the front seat height adjustment mechanism is operatively coupled between the main frame portion and the front wheels and the wheelchair frame further includes a footrest assembly supported on the main frame portion of the wheelchair frame for movement with the main frame portion relative to the two front wheels between the first position and the second position, preferably the platform of the footrest assembly that supports feet of a user thereon is adapted to lay flat against a ground surface supporting the wheelchair frame thereon in the second position of the front seat height adjustment mechanism.

When the wheelchair frame further comprises a front wheel frame portion coupling the front wheels to the main frame portion, the front seat height adjustment mechanism is preferably operatively connected between the front wheel frame portion and the main frame portion. More particularly, the front wheel frame portion may comprise a common frame member supporting both of the two front wheels thereon.

When the front seat height adjustment mechanism selectively retains both front wheels in the first position, preferably the front seat height adjustment mechanism further comprises a single lever which is actuatable to release both front wheels for movement from the first position to the second position.

Preferably, the front seat height adjustment mechanism includes a biasing element which biases the front wheels towards the first position and the front seat height adjustment mechanism is lockable at a plurality of positions between the first position and the second position.

The front wheels may be pivotal beyond the second position up to a folded position in which the front wheels are nearer to a plane of a bottom of the seat than a lowermost portion of the main frame portion of the wheelchair frame. In this instance there may also be provided a retention mechanism arranged to selectively retain the front wheels in the folded position.

Preferably the front wheels are pivotal about a common height adjustment axis relative to the main frame portion between the first position and the second position such that i) an entirety of each front wheel is spaced forwardly of the common height adjustment axis in both the first position and the second position, and ii) each front wheel comprises a caster wheel which is pivotal relative to the main frame portion about a vertical caster axis which is spaced forwardly of the common height adjustment axis.

The seat may further comprises a seat bottom and a backrest assembly which is adjustable in angular orientation relative to the seat bottom independently of the front seat height adjustment mechanism.

As described herein, the present invention relates to a new wheelchair frame in the form of a dynamic wheelchair that aims to be comparable to some commercially available ultralight wheelchairs in terms of weight, strength, durability, and stiffness, while at the same time providing a greater range of seat positioning than the existing Elevation™ wheelchair. In particular, a frame lowering mechanism aims to facilitate low-to-the-ground tasks such as floor transfers (an often difficult or unfeasible task for many wheelchair users) and other activities where sustained low level reaching may be required (e.g. playing with children, changing a tire, etc.). The lowering mechanism also serves to fold the front-end of the chair in a compact package to help facilitate car transfers and other storage.

Conversely, it may be beneficial to raise the front end of a wheelchair “on the fly” (i.e. while the user is sitting in the wheelchair). Raising the front end may facilitate various activities, such as eating at a table or transferring into or out of the wheelchair. This front seat raising capability could be especially beneficial to wheelchair users who normally sit in a wheelchair with a relatively low front seat height configured to facilitate foot propulsion. Users in wheelchairs configured thusly often find it difficult to attain a position comfortable for activities at tables or counters.

When raising the front end of the seat above the driving position, the seat may only be raised from the normal driving position by a relatively minor amount, for example only an inch or two, while still being beneficial for eating at a table or transferring for example. Although turning the wheelchair may not be optimal when using caster wheels due to the upright caster axes not being perpendicular to the ground, this disadvantage could be readily overcome by various means, for example by the use of omnidirectional wheels, or by use of an additional linkage to keep the caster axes perpendicular to the ground through the range of different elevations. Where desired, the seat can of course be raised above the normal driving position by a much greater amount than an inch or two, particularly when the problem of a non-vertical caster axis is overcome. However, any resistance to turning in an elevated, or lowered position, relative to normal driving position typically would not be problematic as in many instances where one would want to raise or lower the front end, you would not be driving.

The kneeling wheelchair frame described here could foster such improved functionality during STS with a further embodiment of the invention. The footplate would be replaced with one incorporating a thin surface such that the footplate could be positioned flush with the ground to provide a stable standing surface for the user. To use the sit-to-stand assist, firstly, the user creates a stable standing surface by lowering the footplate (e.g. approximately 7 cm in the illustrated embodiment), although this would depend on the user's size and desired specific geometry of the frame) so it lies flush to the ground. This achieved by lowering the front frame height, as is performed during the kneeling function described in the other embodiments. Secondly, a lifting/standing assist is provided through the rear seat height adjustment feature. This adjustment is realized as also described through a gas spring mounted from the wheelchair midframe to the rear of the seat base, operated by a hand lever mounted under the front of the seat; this mechanism is analogous to the Elevation wheelchair currently available on the market. The rear seat height can thus be raised enough to bring the user to a semi-standing (i.e. STS) or full standing position, and provide a higher position to ease the STS activity.

In the preferred embodiment of the STS configuration, both kneeling and rear seat height lifting would be operable with the same hand lever. A Bowden cable would attach to a single hand lever, and split to the two gas springs, one each for the front kneeling function, arid one for the rear seat height. A one-to-two Bowden cable actuation mechanism is well known in industry. When activating the STS function by squeezing the lever, the front end will lower via the kneeling mechanism until the footrest touches the ground. The footrest attachment tube would be rigid such that this bottoming out process would stop once the footrest becomes flush with the ground, and thus regardless of squeezing the lever further, additional front seat lowering would not be possible. Once the footplate is on the ground, and while still squeezing the lever, the user could start to de-weight themselves, that is begin to rise up. This will allow the rear seat to rise and assist the user into a semi-standing position. At the top end of the rear seat height range the lifting assist will cease and the user would be free to release the lever and stand up out of the wheelchair.

With the addition of other components such as knee straps, and by using a longer stroke gas spring for the rear seat lifting mechanism, a standing wheelchair can also be realized. In the preferred embodiment of the standing configuration, the process of moving the rear seat upwards while the front of the seat moves down would be the same as in the semi-standing or sit-to-stand (STS) configuration. The footplate would similarly bottom out on the ground to support standing, while the rear of the seat continued rising. Alternatively, and as described earlier, the front and rear seat heights could be moved independently. The difference between the STS and standing configurations is such that with the standing configuration the rear of the seat can rise further into a full, or nearly full, standing position.

Various embodiments of the invention will now be described in conjunction with the accompanying drawings in which:

BRIEF DESCRIPTION OF THE DRAWINGS

In the drawings like characters of reference indicate corresponding parts in the different figures.

DETAILED DESCRIPTION

Figure 1:
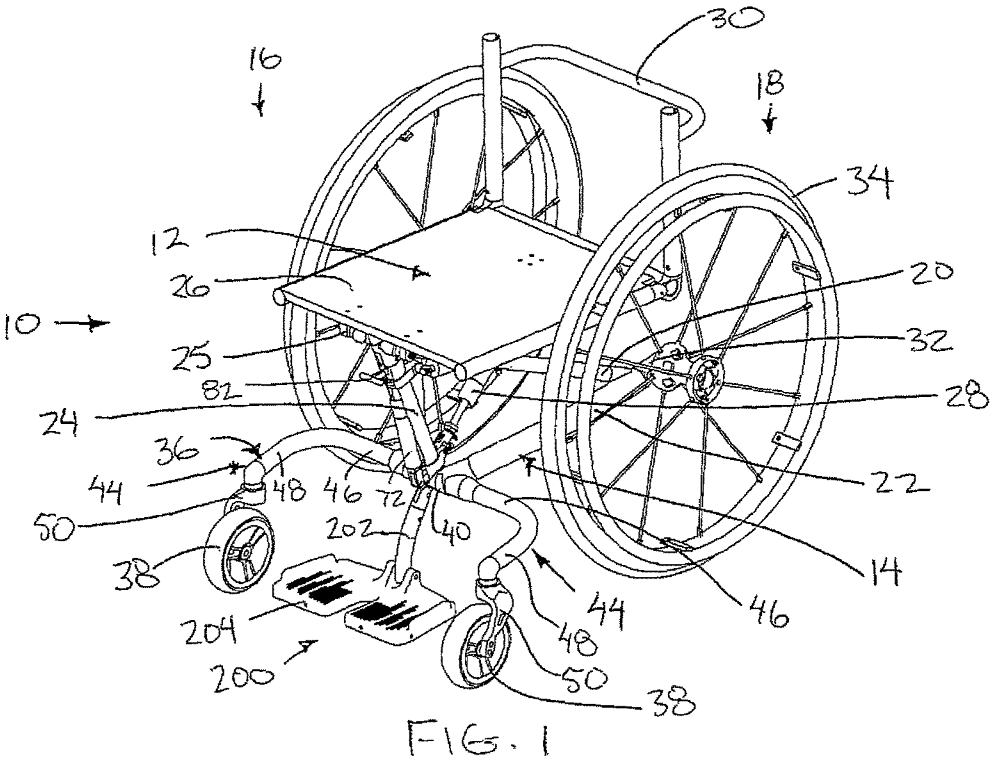
FIG. 1 is a perspective view of a first embodiment of a wheelchair frame.
Figure 2:
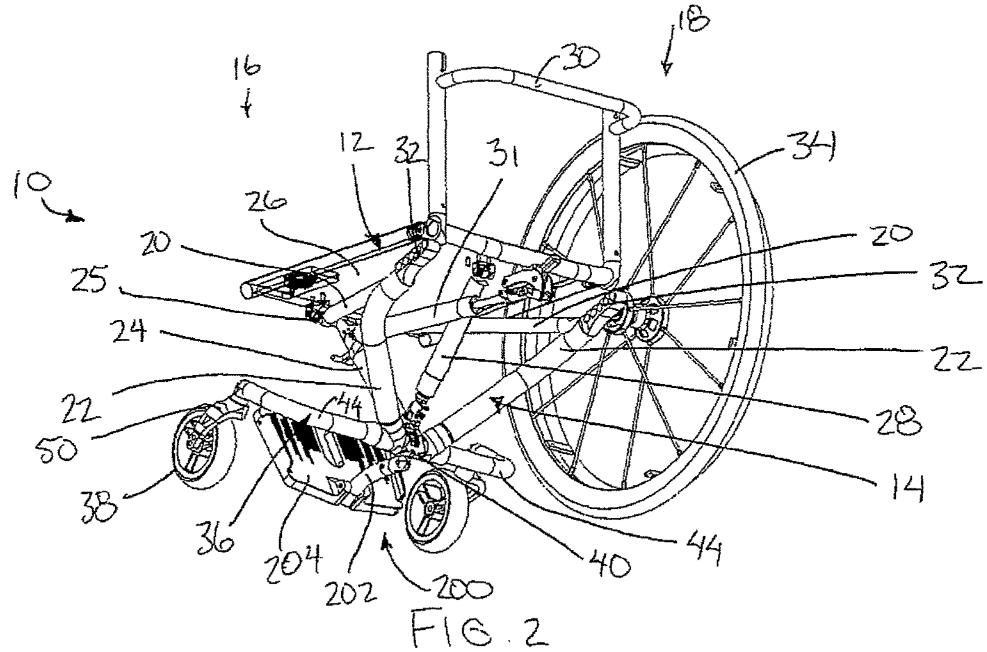
FIG. 2 is a perspective view of the rear side of the wheelchair frame according to FIG. 1.
Figures 3, 4, 5:
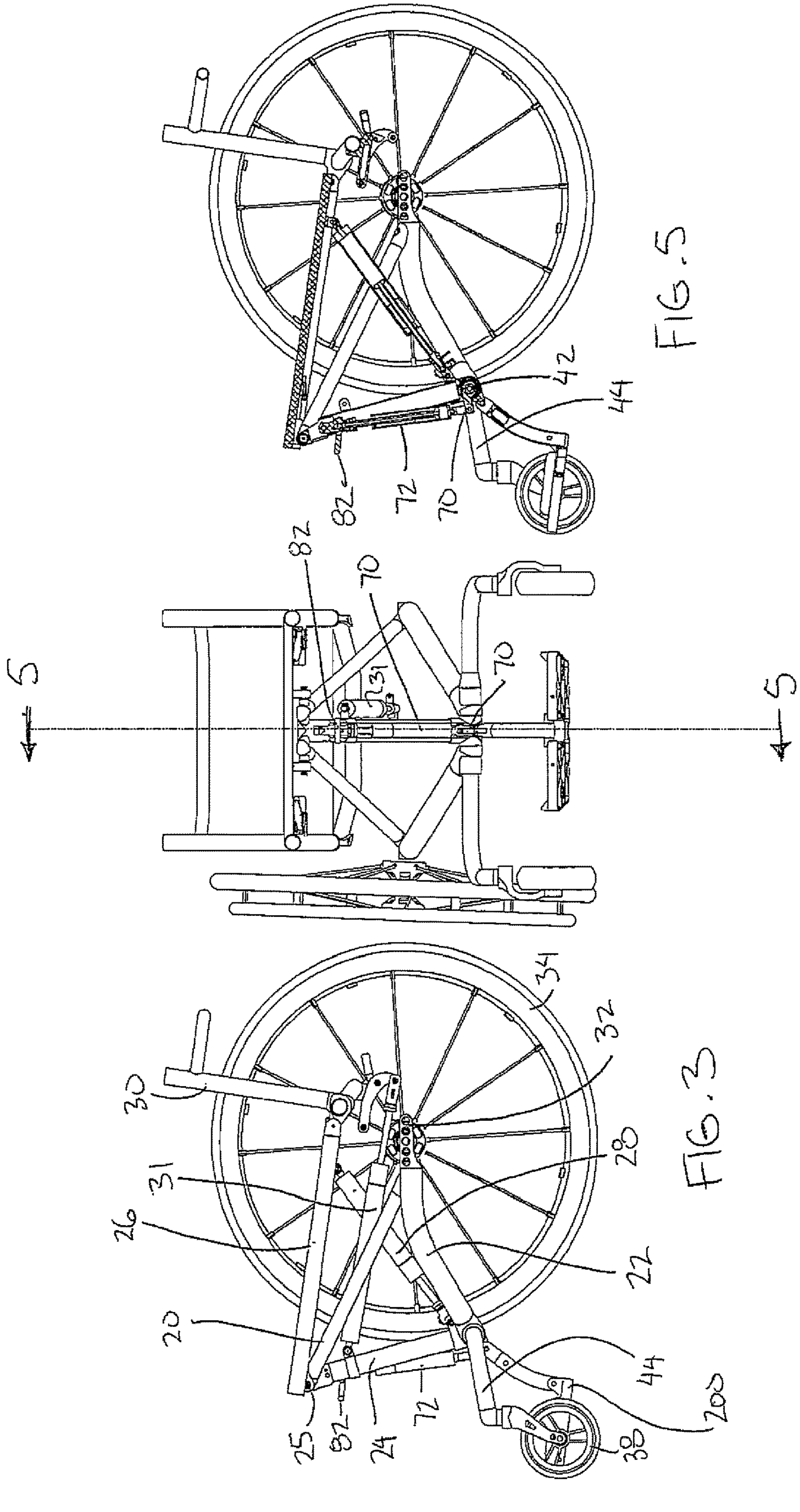
FIG. 3 and FIG. 4 are side elevational and front elevational views of the wheelchair according to FIG. 1.
FIG. 5 is a sectional view along the line 5-5 of FIG. 4.
Figure 6:
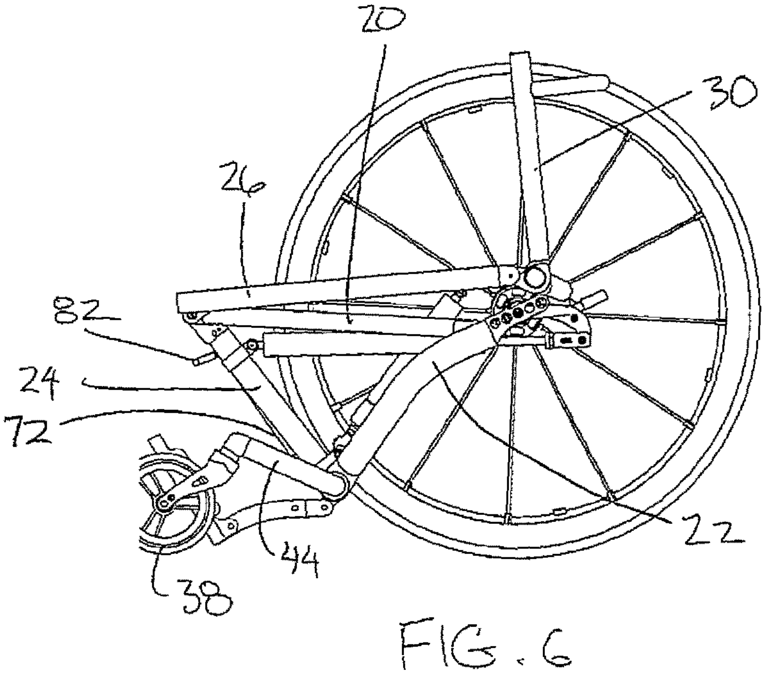
FIG. 6 is a side elevational view of the wheelchair according to FIG. 1 shown in an kneeling position.
Figure 7:
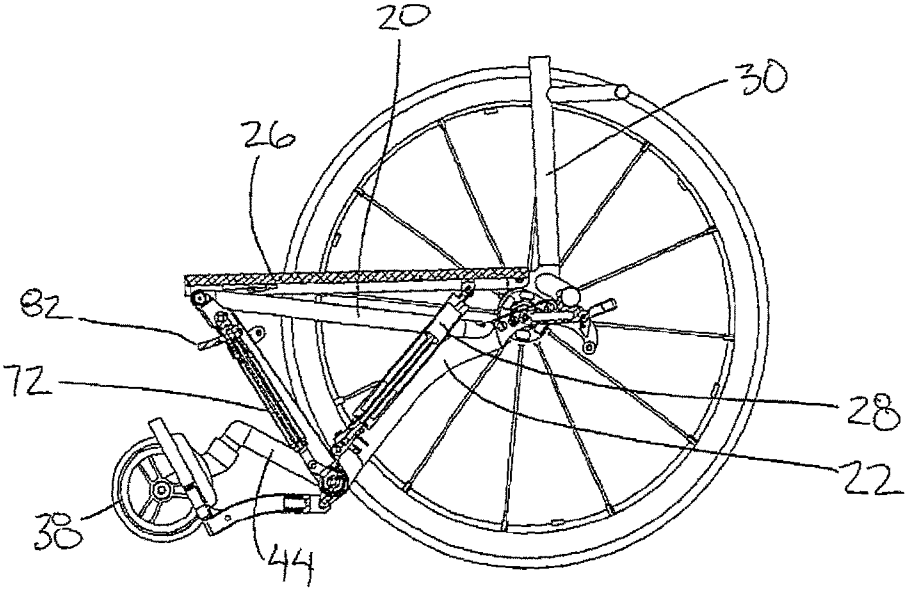
FIG. 7 is a sectional view along the line 5-5 of FIG. 4, but with the wheelchair also shown in the kneeling position.
Figure 8:
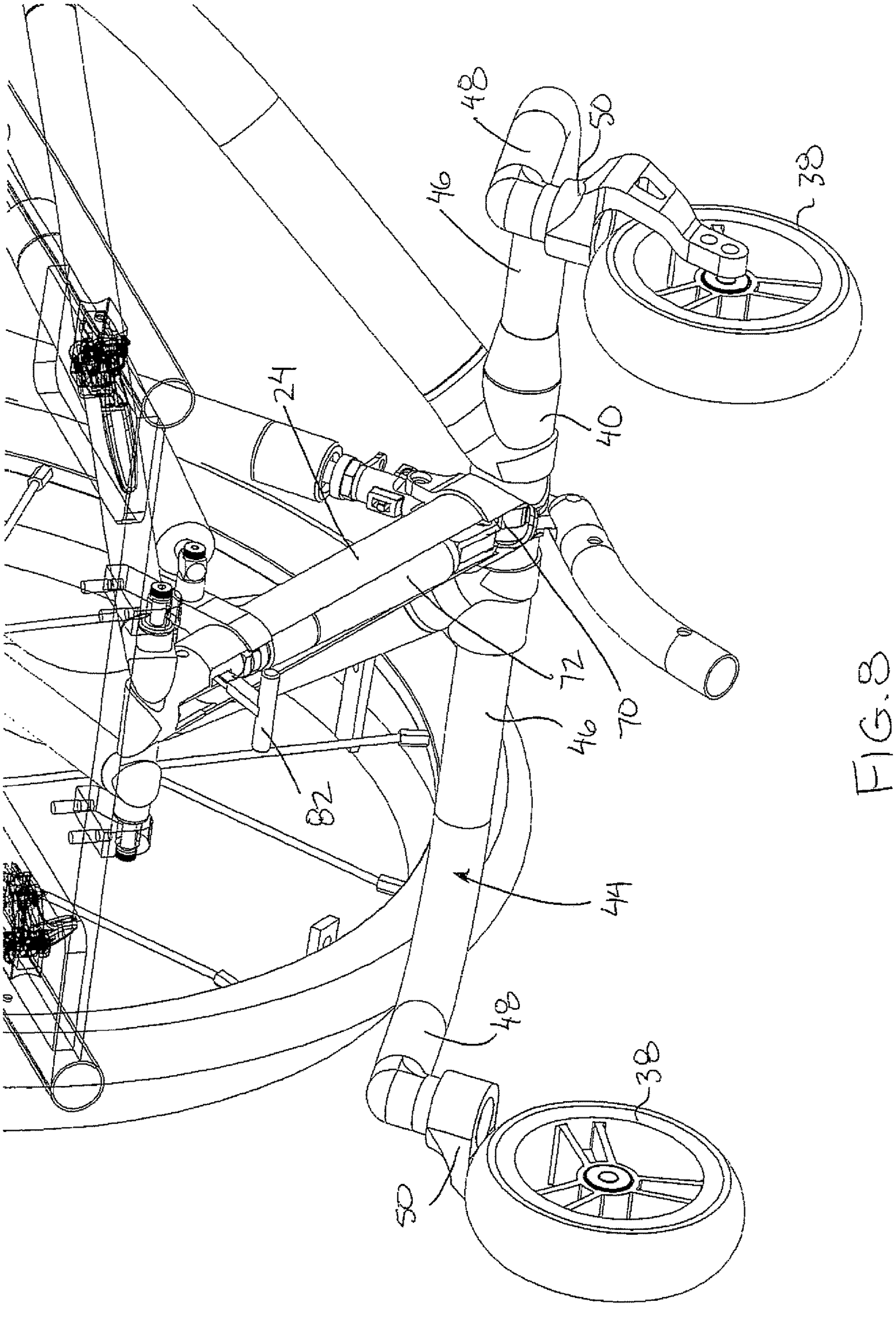
FIG. 8 is a perspective view of a portion of the wheelchair frame of FIG. 1 with some components removed for clarity.
Figure 9:
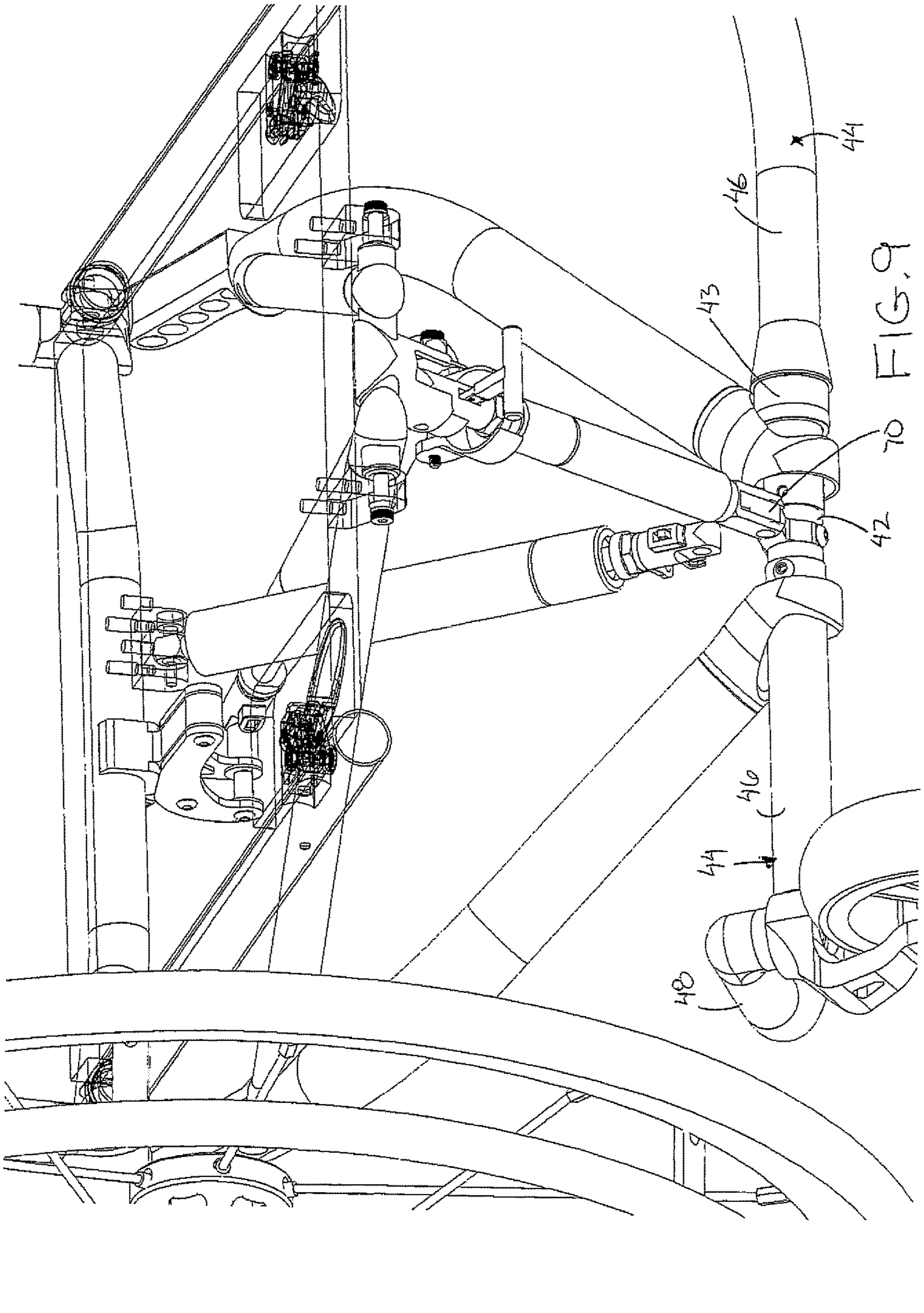
FIG. 9 is a further perspective view of the wheelchair frame according to FIG. 1 with some components shown removed for clarity.
Figure 10:
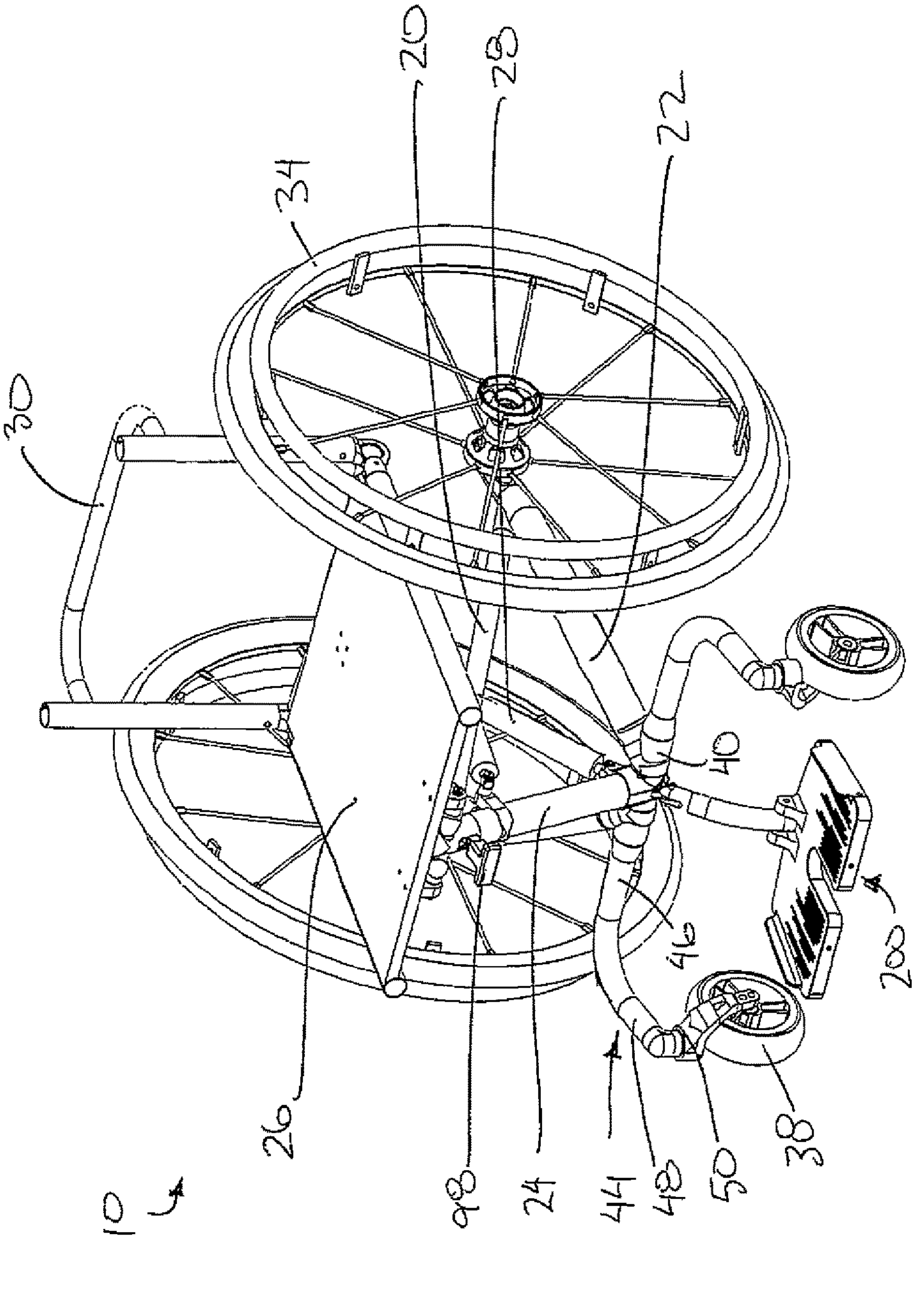
FIG. 10 is a perspective view of a front side of a second embodiment of the wheelchair frame.
Figure 11:
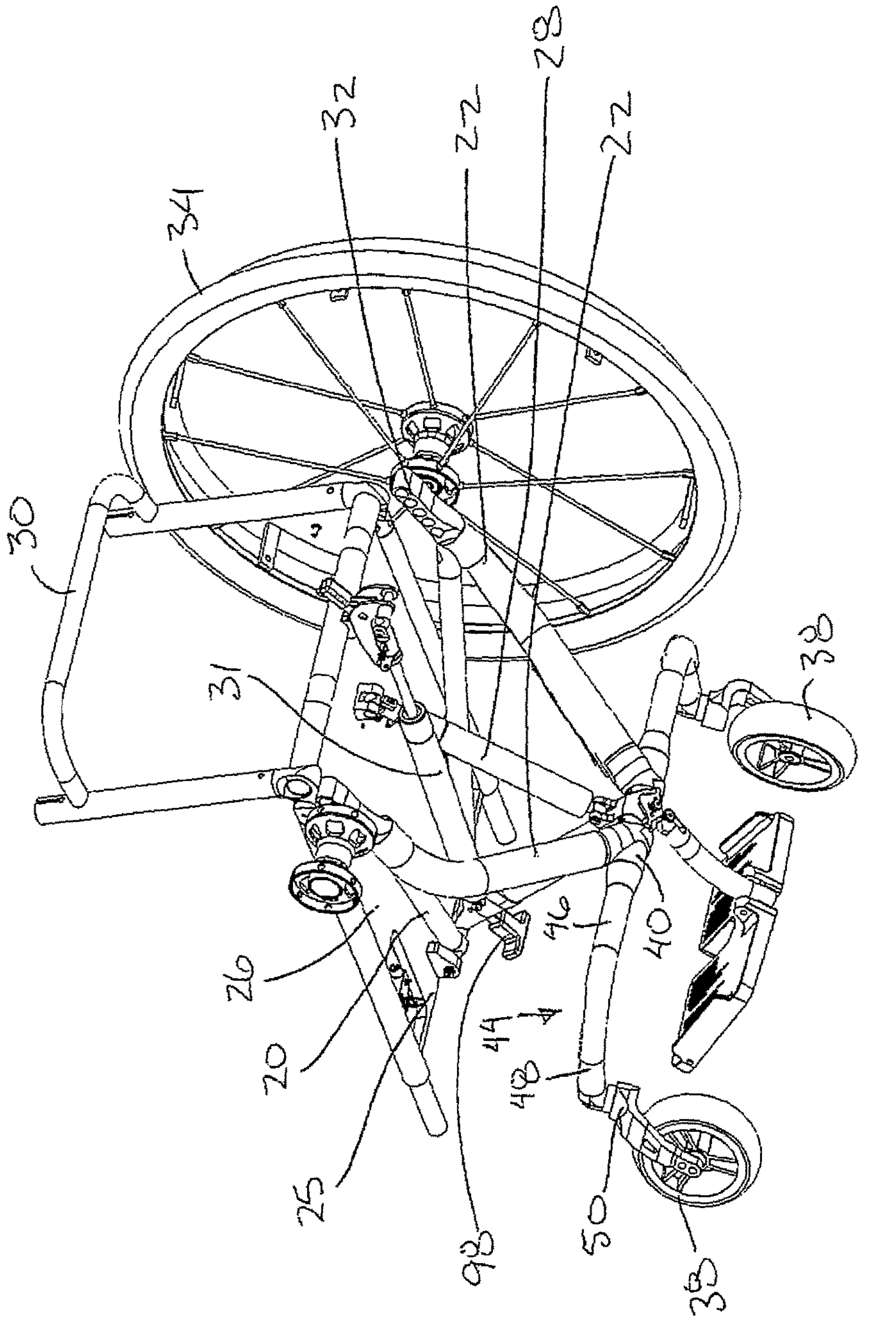
FIG. 11 is a perspective view of a rear and bottom side of the wheelchair frame according to FIG. 10.
Figure 13:
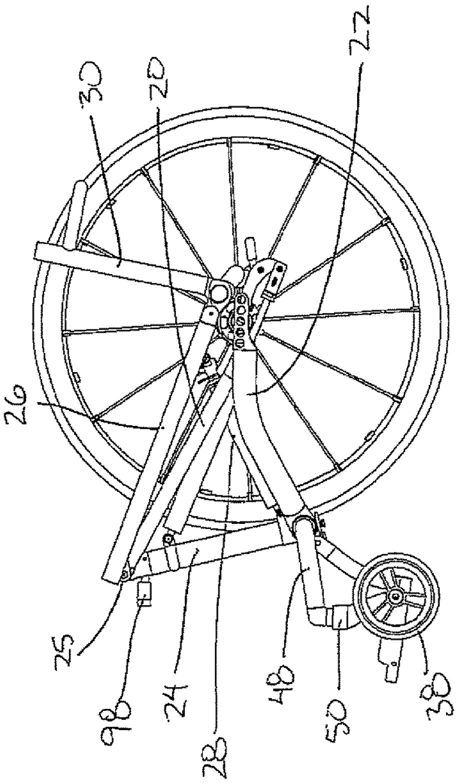
FIG. 12 and FIG. 13 are front elevational and side elevational views of the wheelchair frame according to the second embodiment of FIG. 10.
Figure 14:
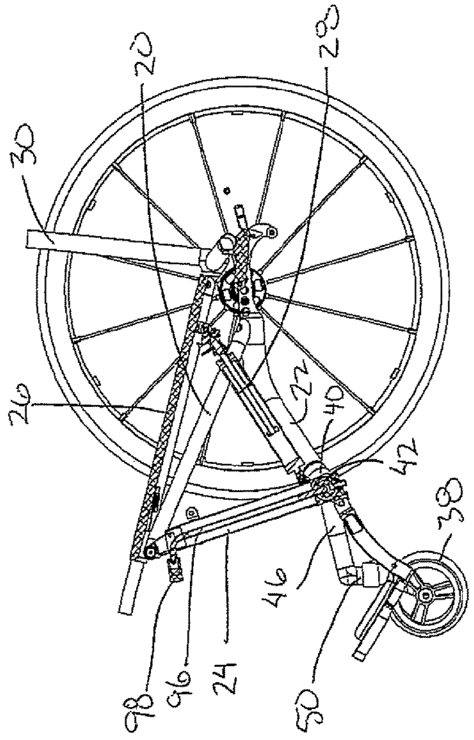
FIG. 14 is a sectional view along the line 14-14 of FIG. 12.
Figure 12:
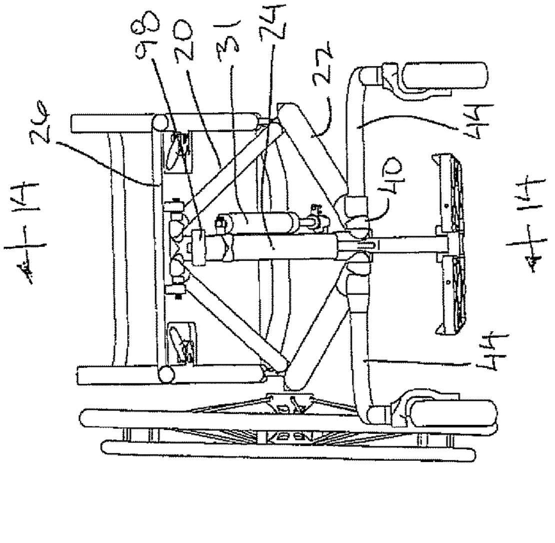
Figure 15:
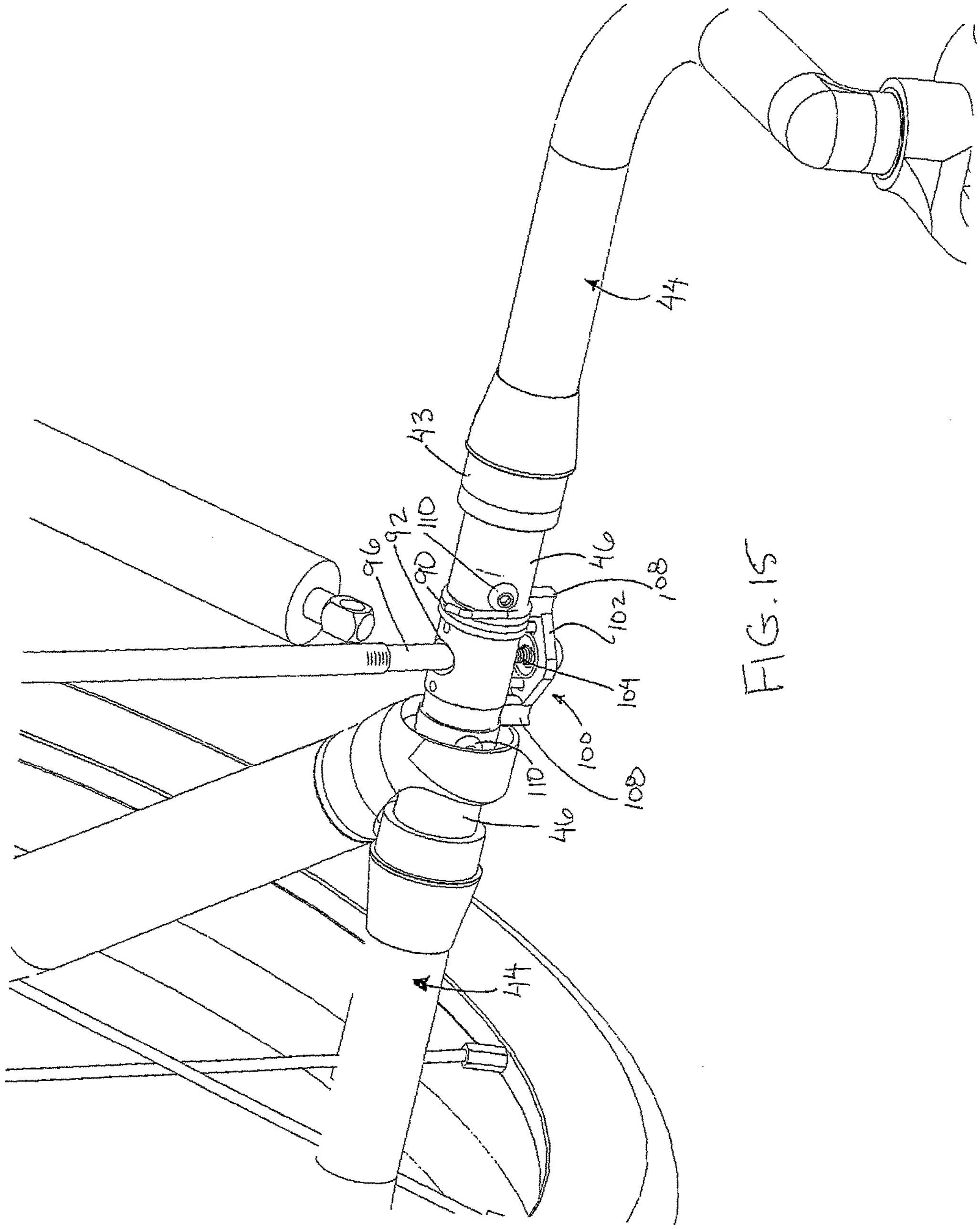
FIG. 15 is a perspective view of a portion of the wheelchair frame according to the second embodiment of FIG. 10, shown with some components removed for clarity.
Figure 16:
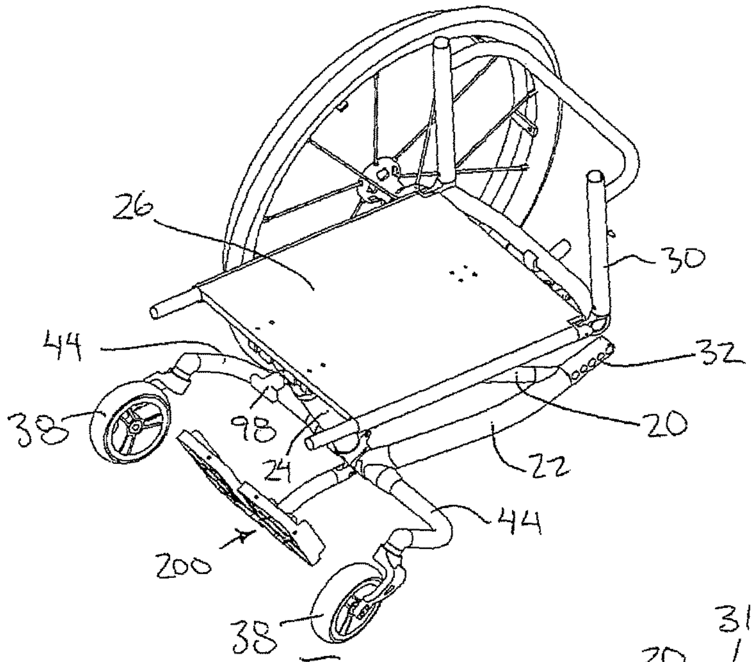
FIG. 16 is a perspective view of the wheelchair frame according to the second embodiment of FIG. 10, shown in the kneeling position.
Figure 17:
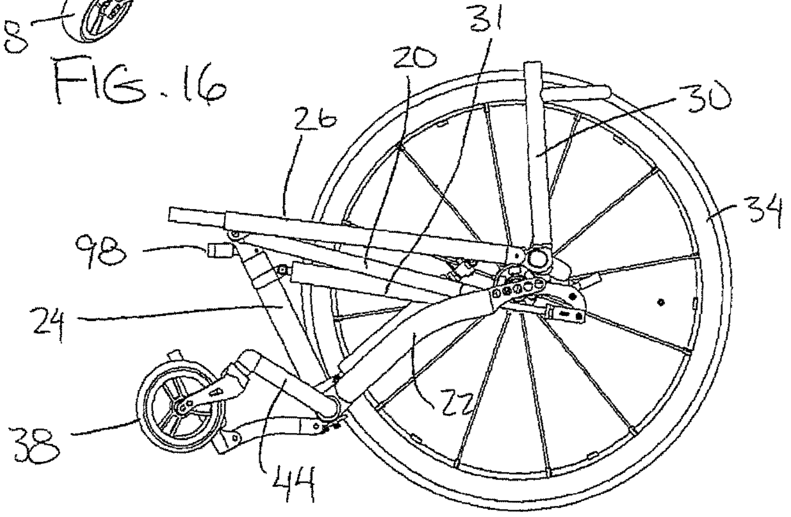
FIG. 17 is a side elevational view of the wheelchair frame according to the second embodiment FIG. 10, shown in the kneeling position.
Figure 18:
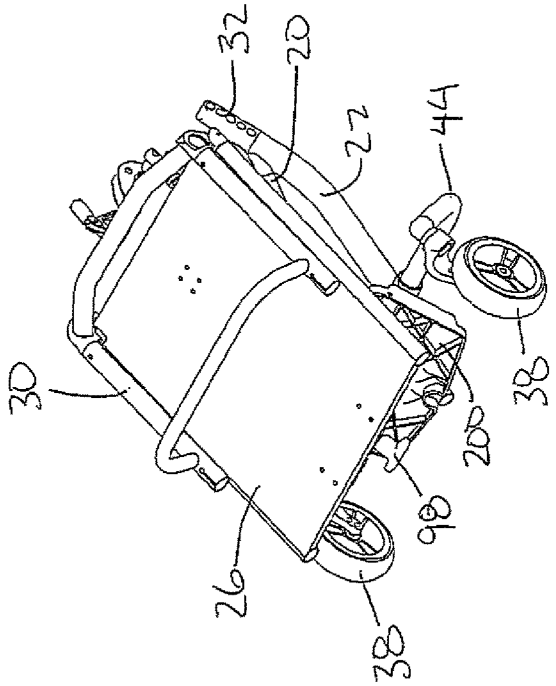
FIG. 18 is a perspective view of the second embodiment of the wheelchair frame in the folded position.
Figure 20:
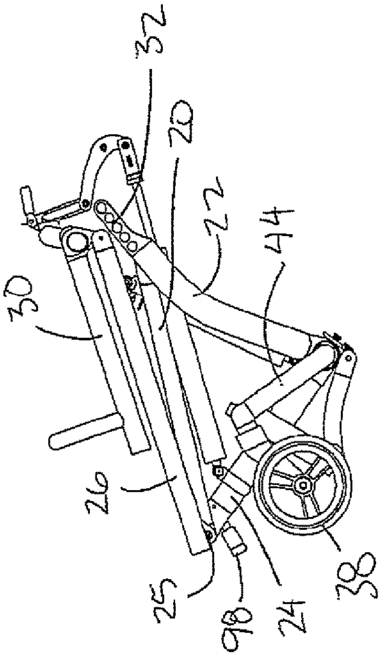
FIG. 19 and FIG. 20 are front elevational and side elevational views of the folded wheelchair frame according to FIG. 18.
Figure 19:
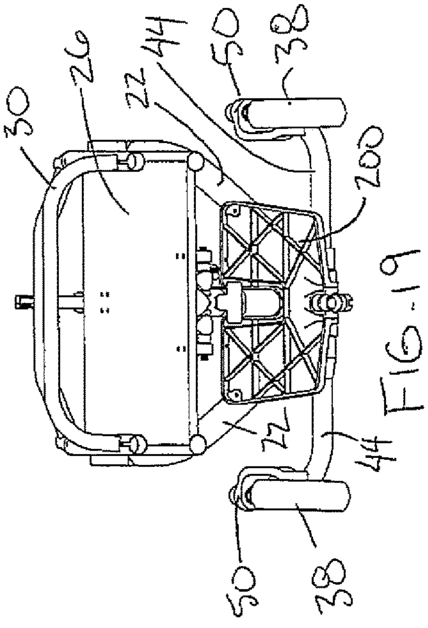

Referring to the accompanying figures, there is illustrated a wheelchair including a wheelchair frame 10 and a seat 12 for supporting a user thereon in a forward facing orientation. The wheelchair frame incorporates a front height adjustment mechanism which permits a height between a front end of the seat and the ground upon which wheels of the wheelchair are engaged to be adjusted through a range of different heights independently of a height of the rear end of the seat relative to the ground as described in further detail below.

Although various embodiments of the wheelchair frame 10 are shown in the accompanying figures, the common features of the various embodiments will first be described.

The frame 10 of the wheelchair includes a plurality of frame portions. In particular, the wheelchair frame includes: i) a main frame portion 14 extending longitudinally between a front end 16 and a rear end 18; ii) a rear seat frame portion 28 connected between a rear end of the seat and the main frame portion 14; iii) a rear wheel frame portion 32 connected between the main frame portion 14 and two rear wheels 34 respectively; iv) a front seat frame portion 25 connected between a front end of the seat and the main frame portion 14; and v) a front wheel frame portion 36 connected between the main frame portion 14 and the two front wheels 38 respectively. At least one of the rear seat frame portion 28 or the rear wheel frame portion 32 is adjustable to adjust a height of the rear end of the seat relative to the wheels, and at least one of the front seat frame portion 25 and the front wheel frame portion 36 is adjustable to adjust a height of the front end of the seat relative to the wheels separately and independently from the height adjustment at the rear end of the seat.

More particularly, the main frame portion 14 includes a first side portion and a second side portion joined together by a front portion 24 at the front end 16 of the frame such that each of the side portions extends generally rearwardly in the longitudinal direction at an outward inclination in the lateral direction away from the opposing side frame portion. Each side frame portion comprises an upper frame member 20 and a lower frame member 22 which are spaced apart in elevation at the front end of the wheelchair frame but which converge towards one another to be joined together at respective rear ends located at the rear end of the wheelchair frame. Each upper frame member 20 extends rearwardly at a laterally outward and downward inclination, whereas each lower frame member 22 extends rearwardly at an upward and laterally outward inclination in a normal driving position.

The front ends of the two upper frame members 20 are connected together at the front end of the wheelchair frame by the front portion 24 of the main frame. Similarly the two lower frame members are connected together with one another approximately by the front portion 24 of the main frame at the front end of the wheelchair frame at a location space below the front ends of the upper frame members 20. The front frame portion 24 in the illustrated embodiment comprises a front post spanning in an upright orientation between the front ends of the lower frame members at the bottom end thereof to the front ends of the upper frame members 20 at the top end thereof. In a normal driving orientation, the front post 24 is normally oriented at a slight downward and rearward angle which is angularly offset from a vertical plane. In further embodiments, the front frame portion 24 could be any structural arrangement such as two spaced apart posts, parallel beams, a triangular frame structure, etc. which spans between the front ends of the upper members 20 and the front ends of the lower members 22 at the front end of the wheelchair frame.

The seat 12 includes a seat bottom frame 26 defining a seat bottom upon which a user is seated. Often, in practice, a seat cushion is placed on top of seat bottom frame 26 for use by user, although this is not shown in any of the figures. In the illustrated embodiment, the front seat frame portion 36 of the wheelchair frame is provided in the form of a pivotal coupling between the upper front end of the main frame 14 at the forward end of the upper frame members 20 to the front end of the seat bottom frame 26. The seat bottom frame 26 is coupled to the main frame portion for pivotal movement about a horizontal axis oriented in a lateral direction, perpendicular to the longitudinal forward direction of the wheelchair.

In the illustrated embodiment, the rear seat frame portion 28 comprises an adjustable linkage the form of a linearly adjustable link member connected at one end proximate the bottom end of the front post 24 and at the other end to a bottom side of the seat bottom frame 26 approximate the rear end thereof. In this manner, varying the length of the link member 28 causes the seat frame to be angularly adjustable relative to the front pivot axis of the front seat frame portion to adjust the angular inclination of the seat bottom relative to the main frame portion as well as adjusting the height of the rear end of the seat bottom relative to the main frame portion independent of the height of the front end of the seat bottom. The link member 28 is preferably a gas spring which is biased in a direction to raise the rear seat height upwardly.

The seat 12 further includes a back rest assembly 30 including an upright backrest frame pivotally coupled at a bottom end to the rear end of the seat bottom frame 26 for relative pivotal movement about a horizontal adjustment axis oriented in the lateral direction so as to be perpendicular to the longitudinal forward direction. The backrest assembly is adjustable independently of the front seat height adjustment mechanism by an extendable link member 31 pivotally coupled at a front end to the main frame portion of the wheelchair at a location spaced below the pivotal connection of the front end of the seat to extend rearwardly in a generally parallel relationship with the bottom of the seat. The rear end of the extendable link member 31 is coupled to an intermediate link which is coupled to both the rear end of the seat bottom and the backrest frame such that the intermediate link, the extendable link member 31, the seat bottom, and a portion of the main frame portion of the wheelchair together define a four bar linkage which maintains general angular orientation of the upright backrest frame relative to the main frame portion of the wheelchair as the backrest frame is elevated together with the rear end of the seat bottom to which it is pivotally coupled as the elevation of the rear end of the seat bottom is adjusted through the rear seat height adjustment mechanism. The link member 31 is a gas spring which remains locked and fixed in length in an unactuated state thereof. Actuating the link member enables adjustment of the length to adjust the angular orientation of the backrest frame relative to the seat bottom and relative to the main frame portion of the wheelchair. The gas spring is biased to fold the seat back frame forwardly against the user seated in the wheelchair, but the biasing force can be readily overcome by the user in the wheelchair leaning rearwardly against the seat back in the actuated state of the link member.

In the illustrated embodiments, the rear wheel frame portion 32 for mounting the rear wheels comprises a plurality of wheel mounting sockets at the rear end of the main frame portion 14. The sockets are provided at the intersection of the upper and lower frame members at each of the laterally opposed side portions of the main frame portion 14, that is at the rear ends of the frame members 20 and 22 at the first side of the wheelchair frame and at the rear ends of the upper and lower frame members 20 and 22 at the second side of the wheelchair frame respectively. The sockets at each of the two laterally opposed side portions of the main frame portion 14 mount respective ones of the two rear wheels 34 thereon. Although some positional adjustments can be made with regard to orientation and position of the rear wheels relative to the main frame portion 14, adjustment of the height of the rear end of the seat bottom frame 26 relative to the main frame portion in a dynamic manner is typically accomplished solely by adjustment of the link member 28 defining the rear seat frame portion of the wheelchair frame to adjust the height relative to the rear wheels and in turn the ground surface supporting the rear wheels thereon.

The front wheel portion 36 which couples the pair of front wheels 38 to the front end of the main frame portion 14 is supported on the main frame portion 14 by a pivot tube 40 of the main frame portion. The pivot tube 40 is located at the bottom front end of the frame in fixed connection between the front ends of the lower frame members of the two laterally opposing sides of the wheelchair frame.

The front wheel portion 36 comprises center tube 42 which is horizontally and laterally oriented to extend between two laterally opposed front tubes 44 supporting respective ones of the two front wheels 38 thereon. Each front tube 44 is a generally L-shaped member having an inner portion 46 connected to the center tube 42 and an outer portion 48 supporting the respective wheel 38 thereon.

The inner portion 46 of each front tube 44 is oriented along a common horizontal axis together with the center tube 42 connected between the two front tubes such that the center tube 42 and the inner ends of the two inner portions 46 of the two front tubes 44 are received within the pivot tube 40 of the main frame portion for common relative pivotal movement about a horizontal adjustment axis which is horizontally oriented in the lateral direction, perpendicular to the forward longitudinal direction of the main frame portion.

The outer portion 48 of each front tube 44 is bent relative to the inner portion 46 so as to project generally forwardly in the longitudinal direction to a forward end mounting the respective front wheel 38 thereon such that the front wheel is positioned entirely forwardly of the horizontal adjustment axis defined by the pivot tube 40 throughout a range of movement of the front wheels between a raised position, a normal driving position, an intermediate kneeling position, and a folded position as described in further detail below.

The front wheel frame portion 36 of the wheelchair frame is commonly pivotal about the horizontal adjustment axis relative to the main frame portion such that the two front wheels 38 are pivoted relative to the main frame portion 14 of the wheelchair frame between a plurality of different heights relative to the front end of the seat bottom frame 26. An annular gap is provided between the outer diameter of the center tube and the inner diameter of the pivot tube by a set of needle bearings 43 at axially spaced apart positions which are operatively connected between the center tube and the pivot tube.

In the driving position, the outer portions 48 of the two front tubes extend forwardly at a slightly downward inclination from the inner portions 46 coupled to the main frame portion to the front wheels 38 supported at the forward ends thereof, corresponding to a normal height of the front end of the seat bottom frame 26 relative to the front wheels and the ground upon which they are supported.

Upon actuation of the front seat height adjustment mechanism, to be described in further detail below, the wheelchair frame can be raised into the raised position or lowered into the kneeling position.

The wheelchair frame is lowered into the kneeling position by pivoting the front tubes 44 upwardly at the forward ends thereof such that in the kneeling position, the outer portions 48 of the front tubes 44 extend forwardly at an upward inclination corresponding to a second reduced height at the front end of the seat bottom frame 26 relative to the front wheels 38 and the ground upon which they are supported.

The front wheel portion 36 of the frame can be further pivoted from the driving position beyond the kneeling position to a folded position in which the outer portions 48 of the front tubes 44 extend upwardly towards the seat bottom frame such that the front wheels are brought closer to the front end of the seat bottom frame than in the kneeling position. In the folded position according to the illustrated embodiment, the entirety of the front wheels are closer to a plane of the seat bottom frame 26 and a lower most portion of the main frame portion 14 is defined by the forward ends of the lower frame members 22 and the pivot tube 40 of the main frame portion.

In some of the embodiments described in the following, it may be possible to fold the front wheel frame portion 36 relative to the main frame portion 14 by turning it in the opposite direction.

Upon actuation of the front seat height adjustment mechanism, the wheelchair frame can also be raised from the driving position to the raised position by pivoting the front tubes 44 downwardly at the forward ends thereof such that in the raised position, the outer portions 48 of the front tubes 44 extend forwardly at a more substantial downward inclination corresponding to a second raised height at the front end of the seat bottom frame 26 relative to the front wheels 38 and the ground upon which they are supported.

Again, referring generally to the various embodiments, in each instance, there is provided a foot rest assembly 200 comprising a main tube 202 which is pivotally connected at a rear end to the bottom side of the main pivot tube 40 of the main frame portion of the wheelchair frame. The main tube extends generally forwardly at a downward inclination to a bottom end pivotally supporting a platform 204 thereon. The platform 204 can be pivoted upwardly and rearwardly towards the main tube 202 and the main tube 202 can be pivoted upwardly towards the seat bottom frame 26 for storage in the folded position. According to a further embodiment of the present invention, an additional parallel link (not shown) may be coupled between the crank arm 70 of the first embodiment and a location on the main tube 202 such that the platform 204 of the footrest assembly is automatically pivoted upwardly together with upward pivoting of the front wheel portion of the frame from the driving position to the kneeling position, and remaining at a relatively constant angle with respect to the ground to effect a usable footrest platform at all heights of the front end.

Turning now to the first and second embodiments of FIGS. 1 through 22, each front wheel 38 in this instance comprises a castor wheel which is supported for rolling movement about first horizontal rolling axis on a castor frame 50 which is in turn pivotally coupled to the front end of the respective front tube 44 for free rotation about an upright axis. In both the driving and kneeling positions, the entire front wheel and castor axis defined by the castor frame 50 pivotally coupled to the front tube 44 is situated to be spaced forwardly of the horizontal adjustment axis defined by the pivot tube 40 at the front end of the main frame portion 14 of the wheelchair. In the normal driving position, the castor axis of each front wheel is oriented vertically, however in the kneeling position, the outer portions 48 of the two front tubes are pivoted upwardly such that the castor axis of each front wheel is inclined upwardly and rearwardly.

Turning now more particularly, to FIGS. 1-9, a preferred embodiment of the wheelchair frame includes a front seat height adjustment mechanism which can be adjusted and locked at any one of an infinite number of positions between the raised position and the folded position, including the normal driving position and the kneeling position therebetween. In this instance, the center tube 42 of the front wheel portion of the frame includes a crank arm 70 fixed thereon which protrudes through a corresponding slot in the surrounding pivot tube 40 such that the crank arm projects generally forwardly in a radial direction from the center tube. The crank arm 70 is rotatable together with the center tube relative to the pivot tube. The front seat height adjustment mechanism in this instance further includes a linearly adjustable link connected between the outer end of the crank arm 70 at one end and the main frame portion 14 at the top, front end thereof and at the opposing end.

More particularly, the link 72 comprises a lockable gas spring which is partially received within the front post 24 of the main frame portion of the wheelchair frame. The front post 24 in this instance comprises a generally C-shaped channel which is open along the front side thereof. The link 72 is pivotally connected at the top end internally within the upper end of the front post 24 of the main frame portion. The link 72 is partially received through the open front side of the C-channel to extend generally downwardly to the opposing end which is pivotally coupled to the outer front end of the crank arm 70. The link 72 is linearly extendable in length from a fully extended position corresponding to the uppermost position of the front end of the seat relative to the front wheels to a fully retracted position corresponding to the folded position of the front wheel portion 36 of the wheelchair frame.

As noted above, according to the illustrated embodiment the link 72 comprises a commercially available lockable gas spring. In one suitable example of a lockable gas spring, the gas spring comprises a cylinder portion which receives a piston slidable therein, such that the piston divides the cylinder into two linearly opposed gas chambers. A valve communicates between opposing sides of the piston which is slidable within the cylinder. A rod communicates slidably through one end of the cylinder from the piston to an outer end defining the other mounting end of the link. A suitable actuator communicates through the rod from the outer end to the valve in the piston at the inner end. A lever 82 coupled to the outer end of the rod permits the valve to be actuated such that in the open position gas freely flows between the two chambers on opposing sides of the piston to allow the piston to be slidably displaced along the length of the cylinder. When the lever 82 returns to an unactuated position, the valve is closed such that the two gas chambers are sealed relative to one another to lock the position of the piston relative to the cylinder at a selected position. When the valve is opened, the greater surface area at the cylinder ends of the piston biases the link 72 into the fully extended position.

The link 72 could alternatively be a variety of linear positioning and locking mechanisms such as a Mechlok, or a powered linear actuator.

The biasing force is selected to be readily overcome by a weight which is substantially less than the weight of the average user to permit the biasing force of the link to be easily overcome for retracting the wheelchair frame from the driving position to the kneeling position when desired, and for fully retracting the link from the kneeling position to the folded position when desired. More particularly, the biasing force may be selected so that it may not necessarily be overcome when a user assumes a normal posture or leans rearward, but can be readily overcome simply by the user shifting their weight or center of gravity forwardly, for example by slight alteration of trunk position.

The lever 82 is positioned to project generally forwardly from the top end of the front post 24 at a location approximate and slightly below the front end of the seat bottom frame 26.

Figure 28:
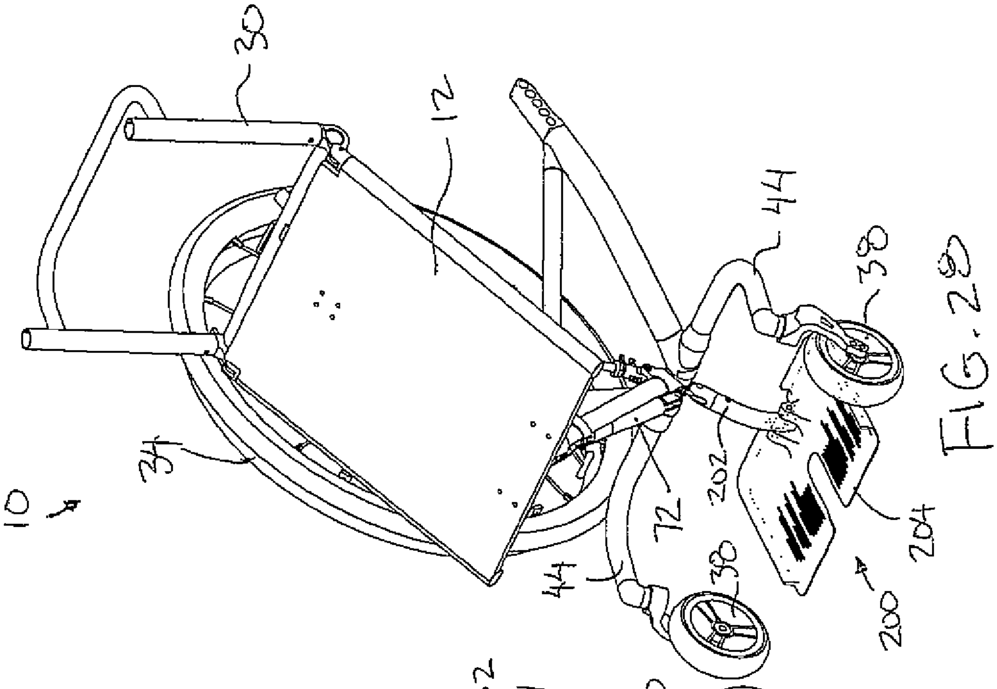
FIG. 28 is a perspective view of the wheelchair frame according to the first embodiment of FIGS. 1 to 9 and 27, also shown in the semi-standing or STS position.
Figure 27:
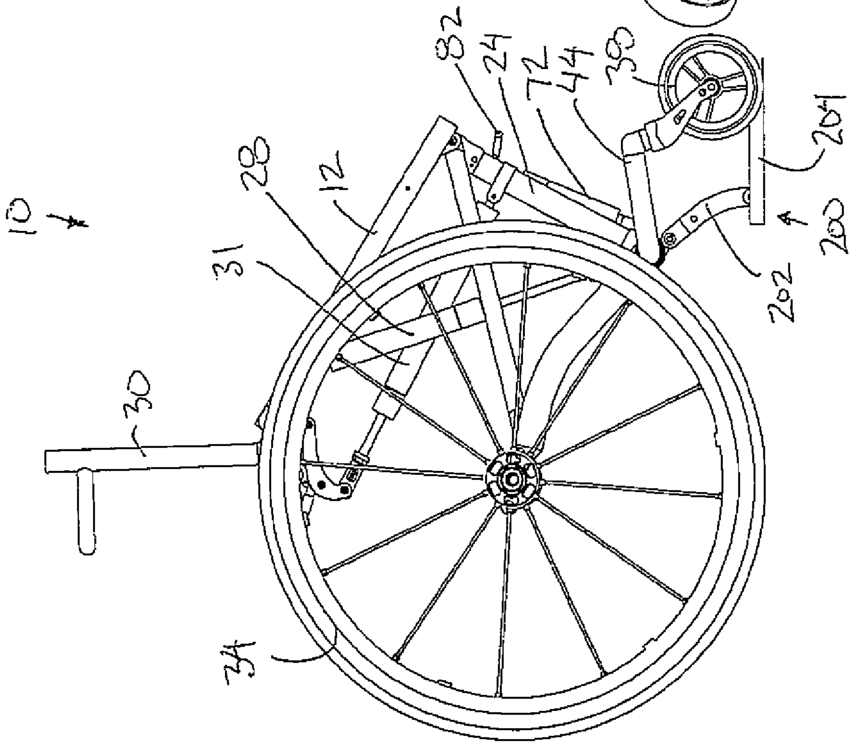
FIG. 27 is a side elevational view of a first embodiment of the wheelchair frame according to FIGS. 1 to 9 in which the foot rest is flush with a ground supporting surface in the second (lowered) position of the front seat height adjustment and the rear seat height adjustment is simultaneously actuated to raise the rear seat height for assisting a user from a sitting position to a standing position.

In FIGS. 27 and 28, the wheelchair according to the first embodiment of FIGS. 1 through 9 is shown in a standing position of the rear seat height adjustment mechanism. Also shown in FIGS. 27 and 28, the front seat height adjustment mechanism is lowered in the kneeling position such that the platform 204 of the footrest assembly lies flat against the ground surface upon which the wheelchair is supported. The footrest assembly 200 is supported throughout movement of the main frame portion of the wheelchair from the normal sitting/driving position to the kneeling position so as to remain fixed in orientation relative to the main frame portion. This can be accomplished in one embodiment by fixing the main post 202 of the footrest assembly relative to the main frame portion of the wheelchair. In this instance the bottoming out of the flat bottom of the platform 204 against the ground surface acts to limit further downward movement of the height of the front end of the seat by actuation of the front seat height adjustment mechanism beyond the kneeling position illustrated in FIGS. 27 and 28.

Alternatively, the front seat height adjustment mechanism may be provided with suitable stops incorporated therein to limit movement of the mechanism beyond the kneeling position illustrated in FIGS. 27 and 28. In one instance this may include arranging the extendable link 72 to reach its end of travel once the height to the front end of the seat reaches the kneeling position corresponding to the flat bottom of the platform 204 of the footrest assembly 200 abutting the ground surface. When the front seat height adjustment mechanism includes suitable stops in this manner, the footrest assembly may remain pivotal relative to the main frame portion of the wheelchair, and/or the platform may remain pivotal relative to the post 202 of the foot rest assembly.

When the wheelchair frame is arranged in the kneeling position of the front seat height adjustment mechanism, the rear seat height adjustment mechanism remains operable for actuation from a normal height corresponding to a normal driving position, to a standing position in which the height of the rear end of the seat is elevated relative to the normal driving position as shown in FIGS. 27 and 28. The extendable link member 28 of the rear seat height adjustment, mechanism in all illustrated embodiments comprises a gas spring which remains locked and fixed in length when the actuator thereof is released. When the actuator is actuated by the user, the extendable link member 28 is released from its locked position to enable the length to be adjusted. The biasing of the gas spring is biased towards an extended position corresponding to biasing of the rear seat height adjustment mechanism from the lowest elevation of the rear end of the seat to the highest elevation of the rear end of the seat which corresponds to the standing position shown in FIGS. 27 and 28. The biasing force provided can be typically overcome by the weight of the user sitting in the seat of the wheelchair; however, any upward movement of the user seated in the wheelchair from the normal driving position towards a standing position will be assisted by the upward biasing force provided by the extendable link member 28 of the rear seat height adjustment mechanism. In the semi-standing position, the seat is typically oriented to extend at an upward and rearward slope from the front end to the rear end thereof.

Figure 30:
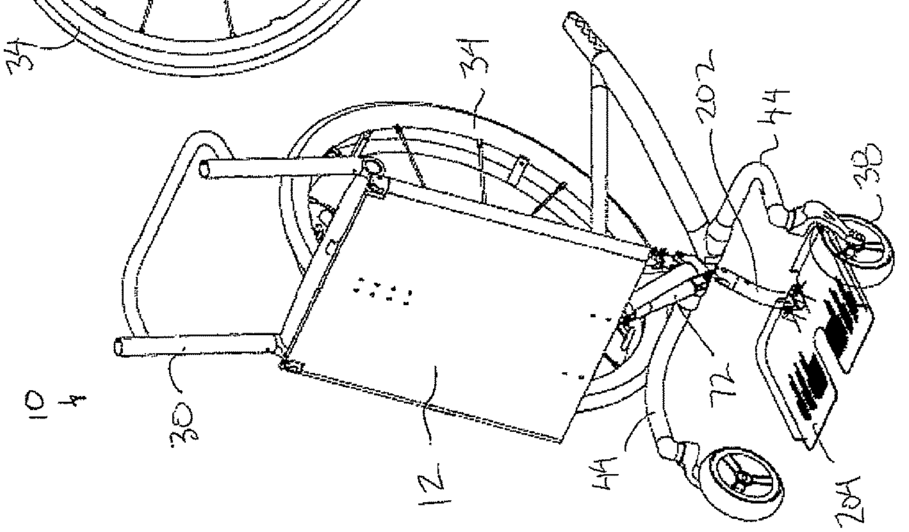
FIG. 30 is a perspective view of an alternative embodiment of the wheelchair which is identical to the first embodiment of FIGS. 1 to 9, except for the seat height adjustment mechanism being provided with a longer stroke to allow for positioning of the wheelchair frame in a standing position as shown. In the standing position, the foot rest is flush with a ground supporting surface in the second (lowered) position of the front seat height adjustment and the rear seat height adjustment is simultaneously actuated to raise the rear seat height for supporting a user in a standing position.
Figure 31:
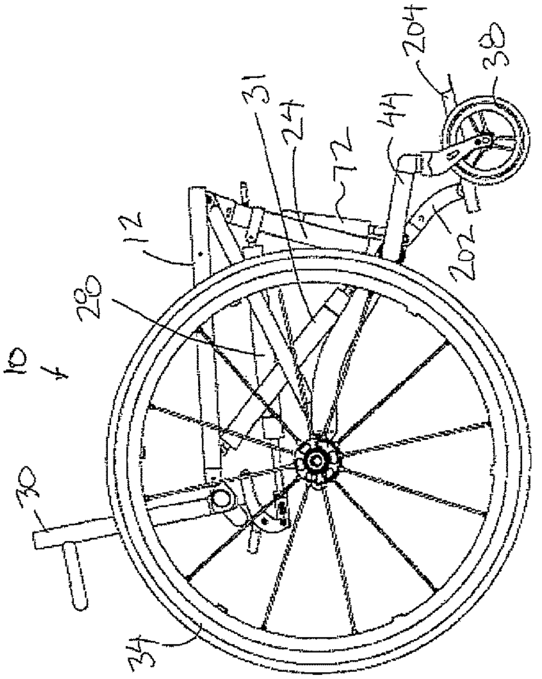
FIG. 31 is a side elevational view the wheelchair according to FIG. 30 shown in a driving position, with the front seat height in the first (raised) position.
Figure 32:
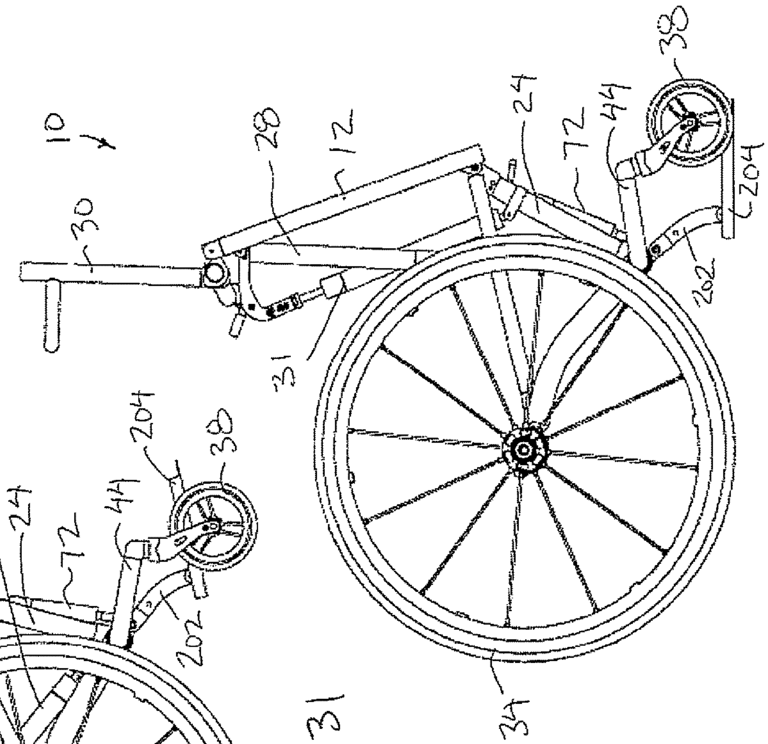
FIG. 32 is side elevational view of the wheelchair frame according to the embodiment of FIGS. 30 and 31, also shown in the standing position.

Turning now to the embodiment of FIGS. 30 to 32, the wheelchair in this instance is identical to the wheelchair described in the first embodiment of FIGS. 1 to 9 and 27 and 28, with the exception of the extendable link 28 being provided with a longer stroke to allow the rear seat height adjustment mechanism to raise the rear end of the seat from the normal driving position of FIG. 31 to a standing position as shown in FIG. 32. In the standing position, the seat bottom extends upwardly at a slight rearward incline from the front end to the rear end of the seat so as to be more vertical than horizontal in orientation.

In further embodiments, the extendable link 28 of either the first embodiment of FIGS. 1 to 9 and 27, and 28, or the alternative embodiment of FIGS. 30 to 32 may comprise a powered link member operated by a motor to allow positioning of the rear seat height adjustment mechanism at any position between a normal sitting/driving position and the semi-standing or standing position regardless of the weight of the user on the seat. Actuation of a powered link member to raise or lower the height of the rear end of the seat member can be accomplished in either the normal sitting/driving position or the kneeling position of the front seat height adjustment mechanism.

In either configuration of the rear seat height adjustment mechanism, the four bar linkage which couples the seat back to the seat bottom typically maintains the seat back at a general set orientation relative to the main frame portion of the wheelchair throughout the range of movement of the rear seat height adjustment mechanism between normal and standing positions thereof.

The sit-to-stand assist or standing feature capitalizes on the front and rear seat height adjustment capabilities inherent in the dynamically adjustable wheelchair. To use the sit-to-stand assist or standing position, firstly, the user creates a stable standing surface by lowering the footplate approximately 7 cm so it lies flush to the ground. This achieved by lowering the front frame height. The adjustment mechanism is based on a centrally mounted gas spring, operated with a hand lever under the front seat, which serves to pivot the wheelchair frame about front wheel assembly. Secondly, a lifting/standing assist is provided through the rear seat height adjustment feature. This adjustment is realized through a gas spring mounted from the wheelchair midframe to the rear of the seat base, operated by a hand lever mounted under the front of the seat; this mechanism is analogous to the Elevation wheelchair currently available on the market [1]. In the tested wheelchair configuration, the rear seat height was increased from 46 cm to 65 cm (i.e. 19 cm), enough to bring the user to a semi-standing position. The use of a longer gas spring would afford the capability to raise the rear of the seat even higher, including into a standing position.

Both adjustments can be easily made by the user from a typical seated position. While the prototype requires users to lower the foot plate and adjust the rear seat height in two separate actions, it is recognized that having one mechanism that would activate these two functions simultaneously would simplify the sit-to-stand assist or standing feature and increase the usability.

Turning now to the second embodiment shown in FIGS. 10 through 22, in this instance, the center tube is biased to pivot the front wheel portion 36 of the frame from the folded position to the kneeling position and from the kneeling position to the driving position by a torsion spring 90 which is helically wound about a portion of the center tube between the center tube and the surrounding pivot tube. The torsion spring is anchored at opposing ends to the center tube and the pivot tube respectively. Again, the biasing force, which biases the front wheel portion of the frame towards the driving position, is selected to be readily overcome by a small portion of the weight of an average user to permit ease of manually deflecting the front wheels into the folded position when desired.

Furthermore, in some instances, biasing may not be needed. The applicant has found in prototype testing that simple gravity acting on the weight of the front wheel frame portion 36 and wheel 38 can be sufficient to lower the wheels relative to the main frame portion from the kneeling position to the normal driving position when the main frame portion 14 is tilted upward and rearward over the rear wheels by the user. In addition for folding/unfolding there is no need for biasing.

In an alternate embodiment of the invention, the wheelchair frame may be rarely if ever used for kneeling, and is primarily for folding and situations where getting back into the wheelchair from the ground is desired. In this situation, if a user finds themselves on the ground (e.g. maybe by choice, or perhaps from falling out of the wheelchair), they could manually make the wheelchair kneel, then get in, then let gravity bias the wheels back to the driving position by transferring weight rearward onto the rear wheels. Manually making the wheelchair kneel can be accomplished by a user activating the lever with one hand, together with either i) gripping the front end casters with the other hand to twist the frame into the desired position, or ii) leaning on the frame with the other hand to urge into the desired position, followed by releasing the lever to return the mechanism to the locked position.

In the second embodiment of FIGS. 10 to 22, to lock the position of the front wheel portion 36 of the frame in a selected position, the center tube is provided with a first socket 92, and an optional second socket 94 at circumferentially spaced locations in the outer surface of the center tube at an axially centered location thereon, in alignment with the bottom end of the front post 24 of the main frame portion 14 connected to the pivot tube 40. A rod 96 is located concentrically within the hollow front post 24 so as to be axially slidable relative to the post corresponding to a radial orientation relative to the center tube. More particularly the rod 96 is longitudinally displaced between a locked condition in which the bottom end of the rod is received matingly within a selected one of the first or second sockets and an unlocked position in which the bottom end of the rod 96 is raised relative to the locked position so as to be fully external of the outer circumference of the center tube and removed from either of the sockets 92 or 94. The first socket 92 is located in the outer diameter of the center tube so as to be aligned with the rod in the driving position, whereas the second socket 94 is angularly offset about the circumference from the first socket so as to align with the bottom end of the rod 96 in the raised position or the kneeling position for example.

A lever 98 is provided for actuating the rod 96 between the locked and unlocked positions. A rear end of the lever 98 is pivotally coupled to the rear side of the front post 24 to project generally forwardly through the front post and externally of the front post at a forward gripping end located in close proximity to but slightly below the front end of the seat bottom frame 26. The top end of the rod 96 is coupled to the lever 98 at an intermediate position between the rear pivot connection thereof to the main frame portion 14 and the forward end arranged to be gripped by a user. Accordingly, when the user raises the forward gripping end of the lever, the rod 96 is displaced upwardly from the locked position to the unlocked position to permit free rotation of the center tube within the pivot tube to pivot the front wheels between different positions thereof. When the front wheels are located in the selected position, displacing the lever downwardly causes the rod 96 to be in turn displaced downwardly for insertion into the corresponding socket into the center tube. The rod 96 is slidably received through a corresponding opening in the surrounding pivot tube 40 to assist in anchoring the center tube relative to the surrounding pivot tube in the selected position.

Figure 21:
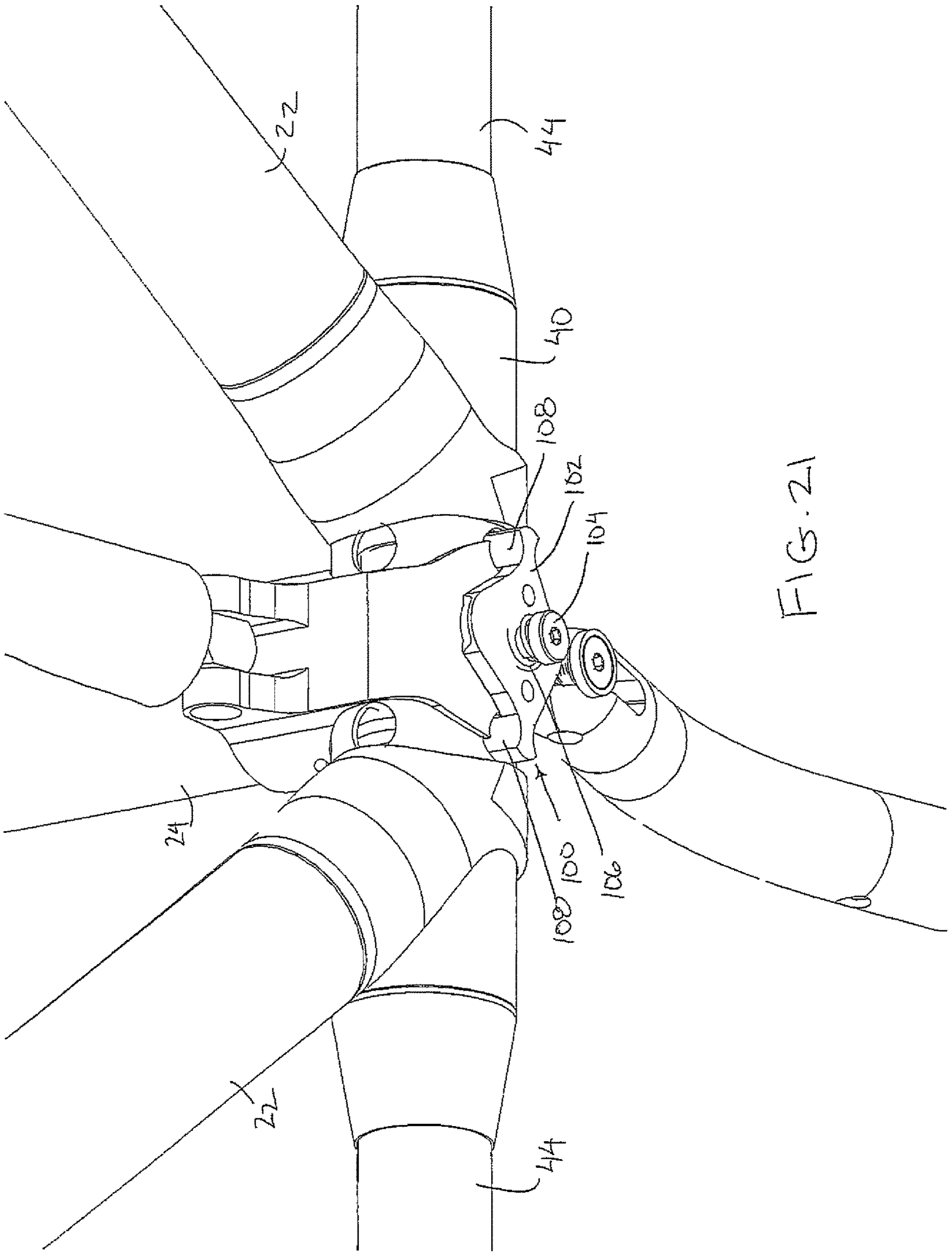
FIG. 21 is a perspective view of a bottom and rear side of the pivot tub which pivotally supports the front castor tubes therein at the front end of the wheelchair frame according to the second embodiment of FIG. 10.
Figure 22:
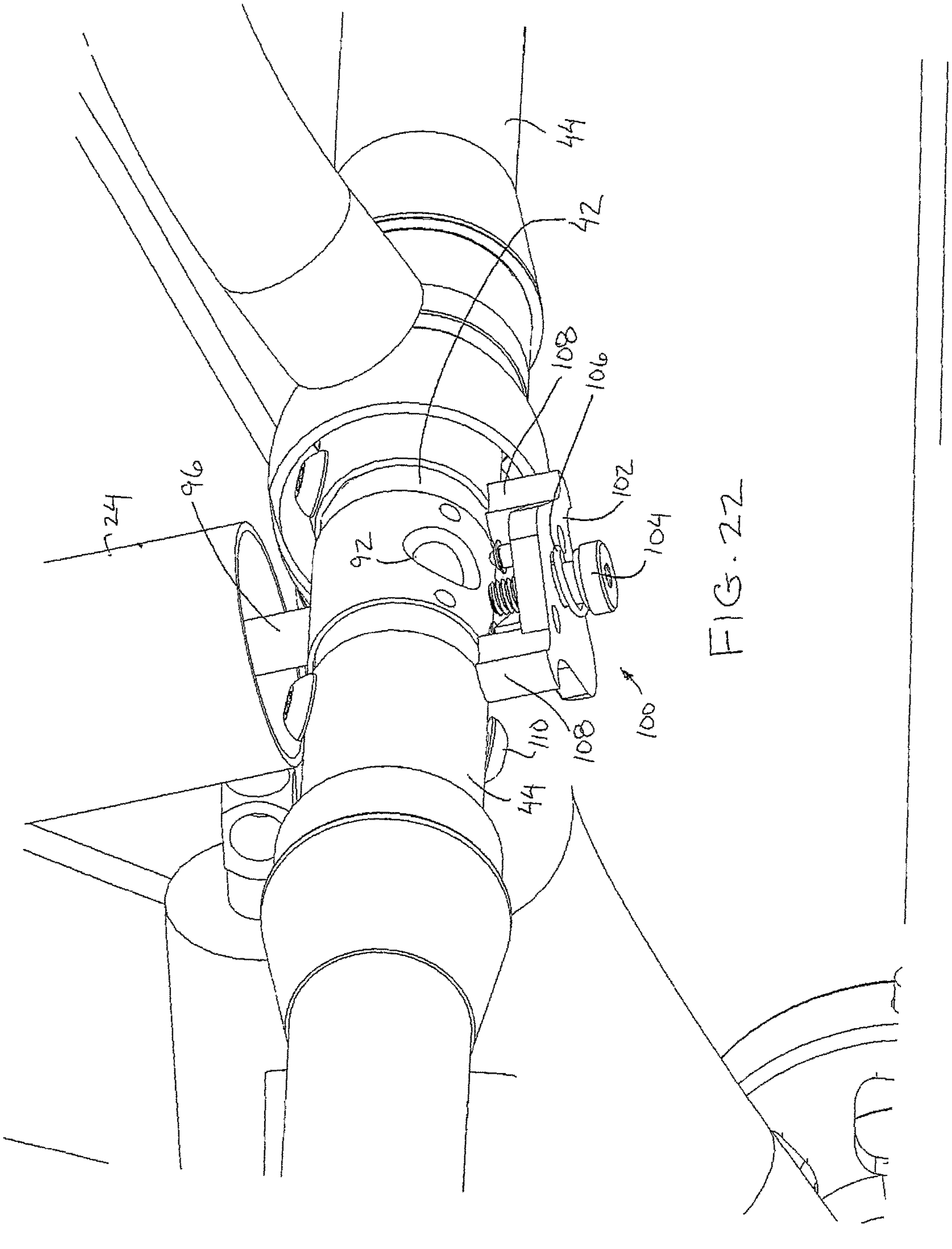
FIG. 22 is a perspective view of a bottom and front of the center tube received in the pivot tube of FIG. 21, but with the pivot tube shown removed.

As further shown in FIGS. 21 and 22, the wheelchair frame according to the second embodiment further includes a stop member 100 which is mounted at the bottom side of the pivot tube 40 of the main frame portion 14. The stop member includes an external body portion 102 which is mounted on a suitable mounting pin 104 to be slidable along the pin in a radial direction relative to the pivot tube and center tube received therein.

A spring 106 is mounted about the mounting pin 104 so as to bias the stop member radially inward towards the center tube. The stop member 100 further includes two lugs 108 supported on the external body 102 to project radially inwardly at axially spaced positions to be received within corresponding apertures in the pivot tube 40 to permit the lugs to be engaged at respective inner ends against the outer periphery of the center tube within the pivot tube. The center tube in this instance further includes a pair of protrusions 110 which protrude outwardly from the outer diameter of the center tube in axial alignment with the two lugs 108 respectively.

In the illustrated embodiment, the protrusions 110 comprise the heads of bolts used to fasten the center tube 40 to the inner ends of the inner portions 46 of the two front tubes 44 of the frame respectively. The bolt heads are located in the circumferential direction about the center tube such that the bolt heads engage one side of the lugs 108 in the kneeling position to prevent further rotation beyond the kneeling position towards the folded position. The user may manual pull the stop member 100 against the biasing of the spring 106 to displace the lugs 108 radially outward from the center tube sufficient to provide clearance for the bolts 110 to permit rotation beyond the kneeling position to the folded position when desired. After the bolt has passed by being rotated circumferentially beyond the two lugs 108, the stop member can be released such that the biasing causes the lugs to again return to the biased position in close proximity to the outer diameter to the center tube in interference relation with the lugs. The lugs 108 of the stop member 100 in this instance then prevent the return of the front wheel portion 36 from the folded condition to the kneeling position by engagement of the protruding bolts 110 with the other sides of the lugs 108. The two opposing sides of each lug 108 each comprise a concave surface arranged to mate with the convex periphery of the bolt head in each position respectively.

In other embodiments for achieving actuable locking movement of the front end, a ratchet/pawl type of system may be used. In further instances, a rotary locking mechanism based on a spring clutch which provides infinite positioning or locking can be used.

In the embodiment of FIGS. 10 to 22, the actuators for the front and rear seat height adjustment mechanism can again be manipulated to provide a sit to stand function by positioning the seat substantially as illustrated in FIGS. 27 and 28.

Figure 23:
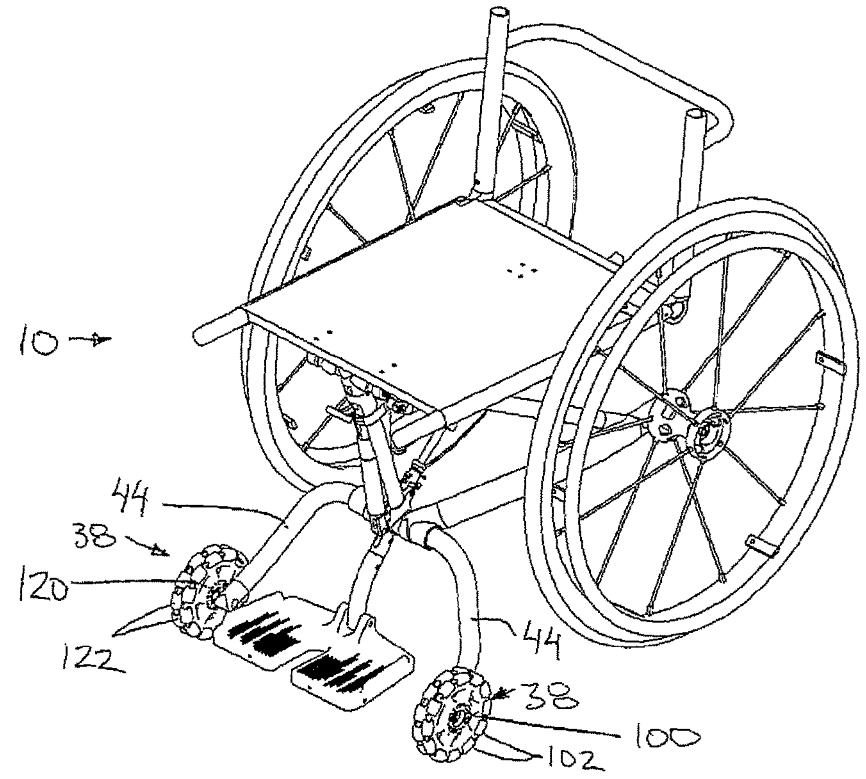
FIG. 23 is a perspective view of a further embodiment of the wheelchair frame using omni-directional front wheels.
Figure 24:
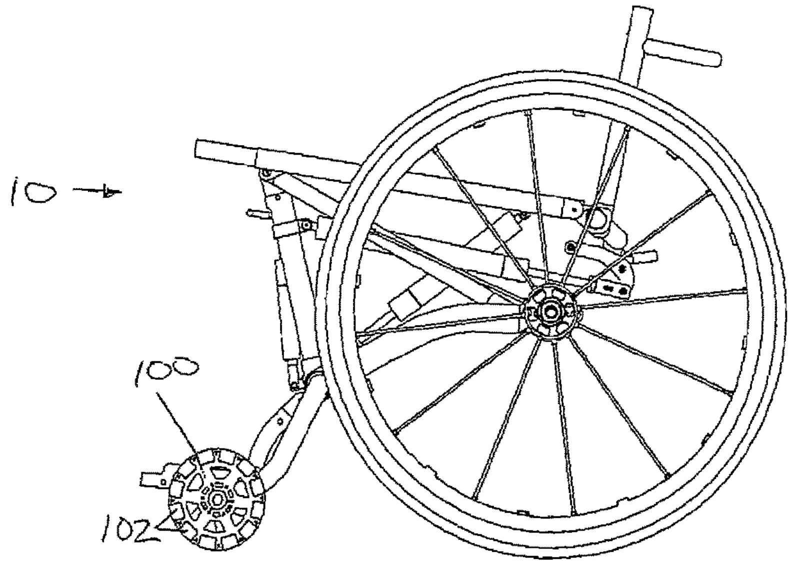
FIG. 24 is a side elevational view of the wheelchair frame according to the third embodiment of FIG. 23.
Figure 25:
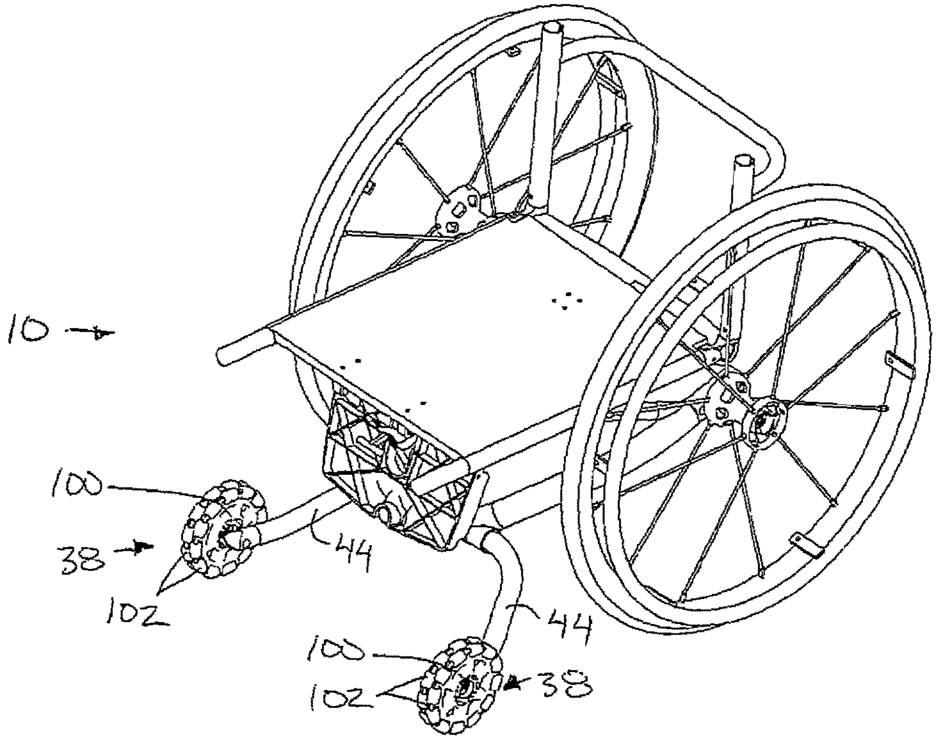
FIG. 25 is a perspective view of the wheelchair frame according to the embodiment of FIG. 23, but shown in the kneeling position instead of the normal driving position.

Turning now to the embodiment of FIGS. 23 through 25, the castor wheels in this instance are replaced with omnidirectional wheels. The omnidirectional wheels can be combined with any of the wheelchair frames described in the previous embodiments. Each front wheel 38 in this instance comprises a central body 120 supported for rotation about a primary horizontal rolling axis. A plurality of peripheral rollers 122 are supported rotatably about the circumference of the central body 120 in which each roller is rotatable about a secondary rolling axis which is at least partially tangentially oriented relative to the primary rolling axis. In this instance, the peripheral rollers 122 allow the front wheels to roll along the ground in a direction of the primary rolling axis without requiring orientation of the primary rolling axis to be pivotal about an upright axis as in the manner of a castor wheel. The use of such a wheel may be advantageous as when the wheel is pivoted into a kneeling position or a raised position from the normal driving position, there is no corresponding upright castor axis which is deflected into an off-vertical position which might resist any pivoting to allow rotation into a lateral direction of the wheelchair.

Figure 26:
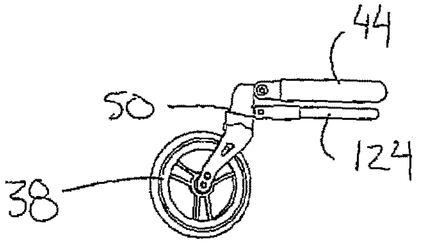
FIG. 26 is a side elevational view of a further embodiment of the front castor tubes when the front wheels comprise castor wheels pivotal about an upright axis.

Turning now to the fourth embodiment shown in FIG. 26, in this instance a further embodiment of a castor wheel according to the first and second embodiments is shown, but in this instance, the castor frame which defines the vertical castor axis of the castor wheel is coupled to the front end of the respective front tube 44 of the wheelchair frame by a pivotal connection. The castor wheel according to FIG. 26 can be used in combination with either of the wheelchair frame according to the first and second embodiments of FIGS. 1 to 22. As shown in FIG. 26, a link 124 is coupled alongside the outer portion 48 of each front tube 44 so as to be pivotally coupled at a forward end to the caster frame at a location spaced from the pivotal connection of the caster frame to the front tube and so as to be pivotally coupled at a rear end to a portion of the main frame portion 14. In this manner as the forward outer portions 48 of the two front tubes are pivoted upwardly, the castor axes of the two front castor wheels remains in a vertical orientation throughout movement from the driving position to the kneeling position to allow free rolling movement in a lateral direction of the wheelchair in the kneeling position.

In yet further embodiments the front seat height adjustment mechanism may comprise a mechanism operating on the front seat frame portion 25 for lowering the connection of the front end of the seat bottom frame 26 relative to the main frame portion 14 of the wheelchair frame. In this instance, the height of the front end of the seat bottom frame can again be varied in elevation relative to the front wheels of the wheelchair, but without altering position of the front wheels relative to the main frame portion 14.

Figure 29:
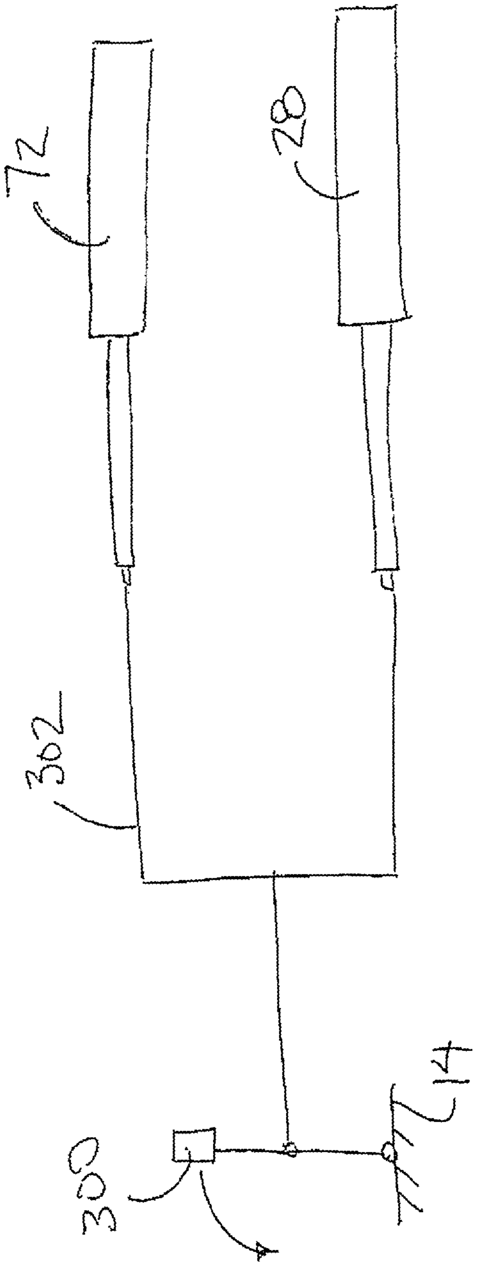
FIG. 29 is a schematic representation of a common actuator for actuating both the front and rear seat height adjustment mechanism simultaneously with a single actuation by the user which can be used on the wheelchair frame according to the first embodiment of FIGS. 1 to 9.

Turning now more particularly to the embodiment of FIG. 29, a further embodiment of the actuating mechanism for wheelchair according to the first embodiment of FIGS. 1 to 9, 27 and 28, and 30 to 32 is illustrated. In this instance, the extendible link member 28 of the rear seat height adjustment mechanism can be operated using a common actuation with the linear adjustable link member 72 of the front seat height adjustment mechanism to provide a sit to stand function. The sit to stand function or standing function is substantially the same as described above with regard to the embodiment of FIGS. 27 and 28 or FIGS. 30 to 32 respectively, by commonly actuating the front seat height adjustment mechanism to lower the front end of the seat to the kneeling position together with actuation of the rear seat height adjustment mechanism to raise the rear end of the seat under biasing provided by the gas spring which functions as the extendible link member 28 of the rear seat height adjustment mechanism. As shown in FIG. 29, the common actuation may be provided by a single lever 300 pivotally supported on the main portion of the wheelchair frame and which is coupled to a suitable one-to-two Bowden cable actuation mechanism 302 coupled between the single lever 300 and the gas springs 72 and 28 of the front and rear seat height adjustment mechanisms respectively.

Since various modifications can be made in our invention as herein above described, it is intended that all matter contained in the accompanying specification shall be interpreted as illustrative only and not in a limiting sense.

According to one prototype built by the applicant, the wheelchair midframe design was fabricated from 1⅜" and ⅞" diameter 2024 Aluminum tubing and CNC-machined 7075 Aluminum billet components, bonded together with epoxy. The rear wheels attach to the frame via rear wheel axle blocks which include 5 axle-receiver holes to allow the wheels to be positioned closer or further from the seat base for a quick centre of gravity adjustment. Standard 5" casters and forks attach to the midframe via two 90 degree bent 1" titanium tubes running through a transverse bearing housing. A footplate is mounted from a central post, and can be folded rearwards during kneeling or when folding the frame for transport.

The seat base was fabricated from honeycomb carbon fiber. Two hollow tubes built into the sides of the seat base accommodate removable handles. The handles were designed to facilitate transfers (i.e. offering an appropriate hand hold) and constrain hip abduction similar to most wheelchair frames. It was also desirable for the handles to be removable in order to create a barrier-free path from the floor to seat during floor-to-seat transfers.

The dynamic seat and backrest angle adjustments are realized (independently) through two gas springs mounted from the wheelchair midframe to the seat base and backrest frame, respectively, similarly to the Elevation™ wheelchair. On-the-fly adjustments to the seat and back are activated using two hand operated levers, mounted under the front seat for easy access, again similarly to the Elevation™ wheelchair.

A "kneeling" feature allows rotation of the front caster assembly, thereby enabling the front of the wheelchair seat to lower towards the ground. As noted above kneeling in some embodiments may be achieved by disengaging a rotary locking mechanism based on a spring clutch. The rotary lock is activated by a cable release, whereby the caster assembly is then free to rotate within its bearing housing. The rotary lock can be "infinitely" locked in any position, thus allowing for a range of lowered front seat heights, such as may be desired for more closely matching the height during different transfers (e.g. floor or toilette). When the casters are in the upright position for wheeling, a locking pin in the central pillar is also engaged for enhanced safety.

Folding of the wheelchair is achieved by removing the rear wheels, rotating the front caster assembly (beyond the position required for kneeling), and folding the seat back forward onto the seat base. When fully folded, the frame encompasses a volume of 55×52×42 cm, compared to the non-folded volume of 55×51×94 cm; both measurements were of the frame without wheels attached.

Images of the prototype wheelchair in the typical wheeling position; with the seat raised; in the kneeling position; and with the frame folded are shown in the accompanying Figures.

REFERENCES

The following documents are referenced in the above disclosure by corresponding number in brackets and are hereby incorporated by reference:

[1] R. A. Cooper, M. L. Boninger, D. M. Spaeth, D. Ding, S. Guo, A. M. Koontz, S. G. Fitzgerald, R. Cooper, A. Kelleher and D. M. Collins, "Engineering better wheelchairs to enhance community participation," IEEE Trans. Neural Syst. Rehabil. Eng., vol. 14, pp. 438-455, December, 2006.

[2] J. Wee and R. Lysaght, "Factors affecting measures of activities and participation in persons with mobility impairment," Disabil. Rehabil., vol. 31, pp. 1633-1642, 01/01; 2012/08, 2009.

[3] H. Y. Liu, R. A. Cooper, J. Pearlman, R. Cooper and S. Connor, "Evaluation of titanium ultralight manual wheelchairs using ANSI/RESNA standards," J. Rehabil. Res. Dev., vol. 45, pp. 1251-1267, 2008.

[4] O. Fliess-Douer, Y. C. Vanlandewijck and L. H. V. Van Der Woude, "Most Essential Wheeled Mobility Skills for Daily Life: An International Survey Among Paralympic Wheelchair Athletes With Spinal Cord Injury," Arch. Phys. Med. Rehabil., vol. 93, pp. 629-635, 4, 2012.

[5] B. S. Mason, L. H. van der Woude and V. L. Goosey-Tolfrey, "Influence of glove type on mobility performance for wheelchair rugby players," Am. J. Phys. Med. Rehabil., vol. 88, pp. 559-570, July 2009.

[6] S. E. Sonenblum, S. Sprigle and R. A. Lopez, "Manual wheelchair use: bouts of mobility in everyday life," Rehabil. Res. Pract., vol. 2012, pp. 753165, 2012.

[7] J. F. Borisoff, "Wheelchair," U.S. Pat. No. 7,845,665, Issued—Dec. 7, 2010.

[8] J. F. Borisoff and L. T. McPhail, "The development of an ultralight wheelchair with dynamic seating." in Proceedings of the 2011 Annual RESNA Conference, Toronto, ON, 2011, pp. 1-4.

[9] J. Reenalda, P. van Geffen, G. Snoek, M. Jannink, M. Ijzerman and H. Rietman, "Effects of dynamic sitting interventions on tissue oxygenation in individuals with spinal cord disorders," Spinal Cord, vol. 48, pp. 336-341, April, 2010.

[10] B. A. Crane, M. B. Holm, D. Hobson, R. A. Cooper and M. P. Reed, "A dynamic seating intervention for wheelchair seating discomfort," Am. J. Phys. Med. Rehabil., vol. 86, pp. 988-993, December 2007.

[11] B. E. Dicianno, J. Arva, J. M. Lieberman, M. R. Schmeler, A. Souza, K. Philips, M. Lange, R. Cooper, K. Davis and K. L. Betz, "RESNA position on the application of tilt, recline, and elevating legrests for wheelchairs." Assistive Technology, vol. 21, pp. 13-22, 2009.

[12] J. Arva, M. R. Schmeler, M. L. Lange, D. D. Lipka and L. E. Rosen, "RESNA position on the application of seat-elevating devices for wheelchair users," Assist. Technol., vol. 21, pp. 69-72; quiz 74-5, Summer, 2009.

[13] D. Ding, E. Leister, R. A. Cooper, R. Cooper, A. Kelleher, S. G. Fitzgerald and M. L. Bonniger, "Usage of tilt-in-space, recline, and elevation seating functions in natural environment of wheelchair users." Journal of Rehabilitation Research and Development, vol. 45, pp. 973-984, 2008.

[14] B. Condon, J. Thorne, J. Borisoff, J. Mattie and W. C. Miller, "Describing associations between dynamic seating usage of the Elevation™ wheelchair and activity and participation." in University of British Columbia Department of Occupational Science and Occupational Therapy Capstone Conference, 2012.

[15] A. M. Cook and J. M. Polgar, Cook and Hussey's Assistive Technologies: Principles and Practice. Mosby, 2007.

[16] M. DiGiovine, R. Cooper, M. Boninger, B. Lawrence, D. VanSickle, A. Rentschler., "User assessment of manual wheelchairs in ride comfort and ergonomics." Arch Phys Med Rehabil, vol 81, pp. 490-4, April 2000.

[17] A. Perdios, B. Sawatsky, W. Sheel, "Effects of camber on wheeling efficiency in the experienced and inexperienced wheelchair user." J Rehabil Res Dev, vol 4(3) p 459-66, 2004.

[18] L. Demers, R. Weiss-Lambrou and B. Ska, "The Quebec User Evaluation of Satisfaction with Assistive Devices (QUEST 2.0): An overview and recent progress," Technology and Disability, vol. 14, pp. 101-105, 2002.

The invention claimed is:

1. A wheelchair frame comprising:

a main frame portion having a front end and a rear end;

a seat supported on the main frame portion so as to be oriented to support an occupant therein in a forward facing orientation;

a rear seat frame portion connected between a rear end of the seat and the main frame portion;

a rear wheel frame portion connected between the main frame portion and two rear wheels, the rear wheels supporting the main frame portion thereon proximate the rear end of the main frame portion;

a front seat frame portion connected between a front end of the seat and the main frame portion;

a front wheel frame portion connected between the main frame portion and two front wheels, the front wheels supporting the main frame portion thereon proximate the front end of the main frame portion;

at least one of the front seat frame portion and the front wheel frame portion comprising a front seat height adjustment mechanism which is adjustable in height so as to effect dynamic adjustment of height of the front end of the seat relative to both of the front wheels simultaneously between a first position and a second position in which the height of the front end of the seat is reduced in the second position relative to the first position while a position of the rear end of the seat relative to the rear wheels as defined by the rear seat frame portion and the rear wheel frame portion remains unchanged.

2. The wheelchair frame according to claim 1 wherein the first position corresponds to a normal driving position and the second position corresponds to a kneeling position.

3. The wheelchair frame according to claim 1 wherein the first position corresponds to an elevated position and the second position corresponds to either one of a normal driving position or a kneeling position.

4. The wheelchair frame according to claim 1 wherein the rear seat frame portion comprises a rear seat height adjustment mechanism operatively connected between the main frame portion and the seat so as to effect adjustment of height of a rear end of the seat relative to the rear wheels, wherein the rear seat height adjustment mechanism enables height of a rear end of the seat to be elevated from a normal driving position to a semi-standing position or a standing position when the front seat height adjustment mechanism is in the second position.

5. The wheelchair frame according to claim 4 wherein the rear seat height adjustment mechanism is biased towards the standing position.

6. The wheelchair frame according to claim 4 wherein the front seat height adjustment mechanism is operable independently of the rear seat height adjustment mechanism.

7. The wheelchair frame according to claim 4 wherein the front seat height adjustment mechanism and the rear seat height adjustment mechanism are linked to a single actuating member such that actuation of the single actuating member enables both lowering of the front end of the seat from the first position to the second position and raising of the rear end of the seat from the normal driving position to one of the semi-standing or the standing position.

8. The wheelchair frame according to claim 1 wherein the front seat height adjustment mechanism is operatively coupled between the main frame portion and the front wheel frame portion that supports the front wheels on the main frame portion.

9. The wheelchair frame according to claim 8 further comprising a footrest assembly supported on the main frame portion of the wheelchair frame for movement with the main frame portion relative to the two front wheels between the first position and the second position, the footrest assembly including a platform for supporting feet of a user thereon which is adapted to lay flat against a ground surface supporting the wheelchair frame thereon in the second position of the front seat height adjustment mechanism.

10. The wheelchair frame according to claim 8 wherein the front wheel frame portion comprises a common frame member supporting both of the two front wheels thereon.

11. The wheelchair frame according to claim 1 wherein the front seat height adjustment mechanism is lockable at a plurality of positions between the first position and the second position.

12. The wheelchair frame according to claim 1 wherein the seat further comprises a seat bottom and a backrest assembly which is adjustable in angular orientation relative to the seat bottom independently of the front seat height adjustment mechanism.

13. A wheelchair frame comprising:

a main frame portion having a front end and a rear end;

a seat supported on the main frame portion so as to be oriented to support an occupant therein in a forward facing orientation;

a rear seat frame portion connected between a rear end of the seat and the main frame portion;

a rear wheel frame portion connected between the main frame portion and two rear wheels, the rear wheels supporting the main frame portion thereon proximate the rear end of the main frame portion;

a front seat frame portion connected between a front end of the seat and the main frame portion;

a front wheel frame portion connected between the main frame portion and two front wheels, the front wheels supporting the main frame portion thereon proximate the front end of the main frame portion;

the front wheel frame portion comprising a front seat height adjustment mechanism which is adjustable in height so as to effect dynamic adjustment of height of a front end of the seat relative to both of the front wheels simultaneously between a first position and a second position in which the height of the front end of the seat is reduced in the second position relative to the first position;

wherein the front seat height adjustment mechanism selectively retains both front wheels in the first position and wherein the front seat height adjustment mechanism further comprises a single actuating member which is actuatable to release both front wheels for movement from the first position to the second position.

14. A wheelchair frame comprising:

a main frame portion having a front end and a rear end;

a seat supported on the main frame portion so as to be oriented to support an occupant therein in a forward facing orientation;

a rear seat frame portion connected between a rear end of the seat and the main frame portion;

a rear wheel frame portion connected between the main frame portion and two rear wheels, the rear wheels supporting the main frame portion thereon proximate the rear end of the main frame portion;

a front seat frame portion connected between a front end of the seat and the main frame portion;

a front wheel frame portion connected between the main frame portion and two front wheels, the front wheels supporting the main frame portion thereon proximate the front end of the main frame portion;

at least one of the front seat frame portion and the front wheel frame portion comprising a front seat height adjustment mechanism which is adjustable in height so as to effect dynamic adjustment of height of a front end of the seat relative to both of the front wheels simultaneously between a first position and a second position in which the height of the front end of the seat is reduced in the second position relative to the first position;

wherein the front seat height adjustment mechanism includes a biasing element which biases the front wheels towards the first position.

15. A wheelchair frame comprising:

a main frame portion having a front end and a rear end;

a seat supported on the main frame portion so as to be oriented to support an occupant therein in a forward facing orientation;

a rear seat frame portion connected between a rear end of the seat and the main frame portion;

a rear wheel frame portion connected between the main frame portion and two rear wheels, the rear wheels supporting the main frame portion thereon proximate the rear end of the main frame portion;

a front seat frame portion connected between a front end of the seat and the main frame portion;

a front wheel frame portion connected between the main frame portion and two front wheels, the front wheels supporting the main frame portion thereon proximate the front end of the main frame portion;

at least one of the front seat frame portion and the front wheel frame portion comprising a front seat height adjustment mechanism which is adjustable in height so as to effect dynamic adjustment of height of a front end of the seat relative to both of the front wheels simultaneously between a first position and a second position in which the height of the front end of the seat is reduced in the second position relative to the first position;

wherein the front wheels are pivotal beyond the second position up to a folded position in which the front wheels are nearer to a plane of a bottom of the seat than a lowermost portion of the main frame portion of the wheelchair frame is to the plane of the bottom of the seat.

16. The wheelchair frame according to claim 15 further comprises a retention mechanism arranged to selectively retain the front wheels in the folded position.

17. A wheelchair frame comprising:

a main frame portion having a front end and a rear end;

a seat supported on the main frame portion so as to be oriented to support an occupant therein in a forward facing orientation;

a rear seat frame portion connected between a rear end of the seat and the main frame portion;

a rear wheel frame portion connected between the main frame portion and two rear wheels, the rear wheels supporting the main frame portion thereon proximate the rear end of the main frame portion;

a front seat frame portion connected between a front end of the seat and the main frame portion;

a front wheel frame portion connected between the main frame portion and two front wheels, the front wheels supporting the main frame portion thereon proximate the front end of the main frame portion;

the front wheel frame portion comprising a front seat height adjustment mechanism which is adjustable in height so as to effect dynamic adjustment of height of a front end of the seat relative to both of the front wheels simultaneously between a first position and a second position in which the height of the front end of the seat is reduced in the second position relative to the first position;

wherein the front wheels are pivotal about a common height adjustment axis of the front wheel frame portion relative to the main frame portion between the first position and the second position.

18. The wheelchair frame according to claim 17 wherein an entirety of each front wheel is spaced forwardly of the common height adjustment axis in both the first position and the second position.

19. The wheelchair frame according to claim 17 wherein each front wheel comprises a caster wheel which is pivotal relative to the main frame portion about a vertical caster axis which is spaced forwardly of the common height adjustment axis.

* * * * *